US008842058B2

(12) United States Patent
Kwak et al.

(10) Patent No.: US 8,842,058 B2
(45) Date of Patent: Sep. 23, 2014

(54) ORGANIC LIGHT EMITTING DISPLAY

(75) Inventors: Won-Kyu Kwak, Suwon-si (KR);
Yang-Wan Kim, Suwon-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 1471 days.

(21) Appl. No.: 11/432,598

(22) Filed: May 11, 2006

(65) Prior Publication Data

US 2006/0267885 A1 Nov. 30, 2006

(30) Foreign Application Priority Data

May 12, 2005 (KR) ................. 10-2005-0039895

(51) Int. Cl.
G09G 3/30 (2006.01)
G09G 3/32 (2006.01)
H01L 27/32 (2006.01)

(52) U.S. Cl.
CPC ...... *G09G 3/3233* (2013.01); *G09G 2300/0842* (2013.01); *G09G 2310/0297* (2013.01); *G09G 2300/0861* (2013.01); *G09G 2300/0819* (2013.01); *H01L 27/3244* (2013.01); *G09G 2320/043* (2013.01); *G09G 2300/0852* (2013.01)
USPC ................. 345/76; 345/77; 345/87; 345/204; 349/39; 349/54

(58) Field of Classification Search
None
See application file for complete search history.

(56) References Cited

U.S. PATENT DOCUMENTS

| 4,728,172 | A | | 3/1988 | Cannella |
|---|---|---|---|---|
| 5,801,673 | A | * | 9/1998 | Shimada et al. .............. 345/100 |
| 5,920,084 | A | | 7/1999 | Gu et al. |
| 6,313,889 | B1 | * | 11/2001 | Song et al. ...................... 349/54 |
| 6,674,495 | B1 | | 1/2004 | Hong et al. |
| 2003/0043131 | A1 | * | 3/2003 | Iguchi ........................... 345/204 |
| 2003/0052843 | A1 | | 3/2003 | Yamazaki et al. |
| 2003/0058389 | A1 | | 3/2003 | Ha et al. |
| 2003/0107535 | A1 | * | 6/2003 | Numao .......................... 345/76 |
| 2004/0046719 | A1 | * | 3/2004 | Wang et al. .................... 345/82 |
| 2004/0104873 | A1 | * | 6/2004 | Kang et al. ..................... 345/87 |
| 2004/0145547 | A1 | | 7/2004 | Oh |

(Continued)

FOREIGN PATENT DOCUMENTS

KR 10-2005-0014124 2/2005
WO WO 00/19476 4/2000

OTHER PUBLICATIONS

Office Action issued by Korean Patent Office dated Jul. 27, 2006.
U.S. Office Action dated Mar. 7, 2013 for U.S. Appl. No. 13/007,371, filed Jan. 14, 2011, which is a Divisional of captioned U.S. Appl. No. 11/432,598.

(Continued)

*Primary Examiner* — Jesus Hernandez
(74) *Attorney, Agent, or Firm* — Knobbe, Martens, Olson & Bear, LLP

(57) ABSTRACT

An organic light emitting display (OLED) is provided. The OLED includes data line capacitors, which is disposed in a plurality of data lines included in a display panel. Each of the data line capacitors has a larger capacitance than a storage capacitor of each pixel. The data line capacitor includes the data line, an insulating layer, a metal, which are stacked. The metal is a cathode or a pixel electrode. The insulating layer of the data line capacitor is a passivation layer, a planarization layer, or a pixel defining layer. The capacitance of the data line capacitor is adjusted by controlling the thickness of the insulating layer or controlling the size of a via hole or a contact hole for controlling the thickness of the insulating layer.

10 Claims, 13 Drawing Sheets

(56) References Cited

U.S. PATENT DOCUMENTS

2005/0112790 A1    5/2005    Lan et al.
2006/0061290 A1    3/2006    Lee
2006/0119556 A1    6/2006    Winters et al.

OTHER PUBLICATIONS

Office Action dated Jul. 9, 2013 for U.S. Appl. No. 13/007,371, filed Jan. 14, 2011, which is a Divisional of captioned U.S. Appl. No. 11/432,598.

* cited by examiner

ORGANIC LIGHT EMITTING DISPLAY

CROSS-REFERENCE TO RELATED APPLICATIONS

This application claims priority to and the benefit of Korean Patent Application No. 10-2005-0039895, filed May 12, 2005, which is incorporated herein by reference in its entirety.

BACKGROUND OF THE INVENTION

1. Field of the Invention

The present invention relates to an organic light emitting display (OLED), and more particularly, to an OLED that makes use of demultiplexers to decrease the number of output lines of data drivers and display an image having uniform luminance.

2. Description of the Related Art

In recent years, a variety of flat panel displays (FPDs) with small weight and volume have been developed to overcome the drawbacks of a cathode ray tube (CRT). The FPDs can be categorized into a liquid crystal display (LCD), a field emission display (FED), a plasma display panel (PDP), an organic light emitting display (OLED), and the like.

An OLED includes an organic light emitting diode, which is a self-emissive display device that emits light through the recombination of electrons supplied from a cathode and holes supplied from an anode. The OLED has a high response speed of about 1 μs and consumes low power. The OLED includes a plurality of pixels, each of which supplies a driving current corresponding to a data signal to the organic light emitting diode using a driving thin film transistor (TFT) so that the organic light emitting diode emits light to display a predetermined image.

FIG. 1 is a block diagram of a conventional OLED.

Referring to FIG. 1, the conventional OLED includes a display panel 10, a scan driver 20, a data driver 30, and a timing controller 40.

The display panel 10 includes a plurality of pixels $P_{11}$-$P_{nm}$, which are disposed in regions where a plurality of scan lines and emission control lines $S_1$-$S_n$ and $E_1$-$E_n$ intersect a plurality of data lines $D_1$-$D_m$. Each of the pixels $P_{11}$-$P_{nm}$ receives a first power supply Vdd and a second power supply Vss from external power supplies and emits light corresponding to a received data signal to display an image. Also, the pixels $P_{11}$-$P_{nm}$ emit light for a time that is controlled according to a signal supplied through the emission control lines $E_1$-$E_n$, respectively.

The scan driver 20 generates a scan signal in response to a scan control signal $S_g$ received from the timing controller 40 and sequentially transmits the generated scan signal to the plurality of scan lines $S_1$-$S_n$ to select the pixels $P_{11}$-$P_{nm}$. Also, the scan driver 20 generates an emission control signal in response to the scan control signal $S_g$ and sequentially transmits the generated emission control signal to the plurality of emission control lines $E_1$-$E_n$ to control the emission.

The data driver 30 receives red(R), green(G), and blue (B) data from the timing controller 40, generates data signals in response to a data control signal $S_d$, and transmits the generated data signals to the plurality of data lines $D_1$-$D_m$. In this case, the data driver 30 transmits data signals corresponding to one horizontal line for each horizontal period to the plurality of data lines $D_1$-$D_m$.

The timing controller 40 generates data control signals $S_d$ and scan control signals $S_g$ corresponding to R, G, and B data supplied from an external graphic controller (not shown) and horizontal and vertical synchronous signals Hsync and Vsync. The data control signals $S_d$ and the scan control signals $S_g$ generated by the timing controller 40 are supplied to the data driver 30 and the scan driver 20, respectively.

In the conventional OLED having the above-described construction, the respective pixels $P_{11}$-$P_{nm}$ are located in the regions where the scan lines and the emission control lines $S_1$-$S_n$ and $E_1$-$E_n$ intersect the data lines $D_1$-$D_m$. Here, the data driver 30 includes m output lines such that it transmits data signals to each of the m data lines $D_1$-$D_m$. In other words, the data driver 30 should include the output lines in a number equal to the number of the data lines $D_1$-$D_m$. Accordingly, the data driver 30 should include a plurality of data integrated circuits (ICs) to install the m output lines, thus elevating the cost of production. In particular, as the display panel 10 increases in resolution and size, the data driver 30 should include more data ICs. Thus, the cost of production further increases.

SUMMARY OF THE INVENTION

The present invention, therefore, provides an organic light emitting display (OLED), which makes use of demultiplexers to decrease the number of data drivers and display an image having uniform luminance.

One embodiment comprises an organic light emitting display (OLED) including a display panel having a plurality of pixels disposed in regions where a plurality of scan lines intersect a plurality of data lines, a scan driver configured to supply scan signals to the scan lines so as to select the pixels, a plurality of demultiplexers configured to supply data signals to the data lines, a data driver configured to supply the data signals to a plurality of output lines connected to the demultiplexers, and a plurality of data line capacitors each disposed in one of the data lines and configured to store a voltage corresponding to the data signal.

Another embodiment comprises an organic light emitting display (OLED) including a substrate, a storage capacitor region, a thin film transistor region, and a data line capacitor region each formed on the substrate. The OLED also has a storage capacitor formed in the storage capacitor region, the storage capacitor including a first semiconductor layer formed on the substrate, a gate insulating layer formed on the first semiconductor layer, a first electrode formed on the gate insulating layer, an interlayer insulating layer formed on the first electrode, and a second electrode formed on the interlayer insulating layer, where the second electrode is electrically connected to the first semiconductor layer. The OLED also has a thin film transistor formed in the thin film transistor region, the thin film transistor including a second semiconductor layer formed on the substrate, a gate insulating layer formed on the second semiconductor layer. The OLED also has a gate electrode formed on the gate insulating layer, a source electrode formed on the gate insulating layer, and a drain electrode formed on the gate insulating layer, and a first data line capacitor formed in the data line capacitor region, the first data line capacitor including a third semiconductor layer formed on the substrate, a gate insulating layer formed on the third semiconductor layer, an interlayer insulating layer formed on the gate insulating layer, and a data line formed on the interlayer insulating layer. The OLED also has an organic light emitting diode formed on the storage capacitor and the thin film transistor and including a pixel electrode connected to one of the source and drain electrodes, an organic emission layer formed on the pixel electrode, and an opposite electrode formed on the storage capacitor, the thin film transistor, and the first data line capacitor. The OLED also has a second data line capacitor formed on the data line capacitor, the second data line capacitor including the data line, an insulating layer formed over the data line, and the opposite electrode.

Another embodiment comprises an organic light emitting display (OLED) including a substrate, a storage capacitor region, a thin film transistor region, and a data line capacitor region each formed on the substrate. The OLED also has a storage capacitor formed in the storage capacitor region, the storage capacitor including a first semiconductor layer formed on the substrate, a gate insulating layer formed on the first semiconductor layer, a first electrode formed on the gate insulating layer, an interlayer insulating layer formed on the first electrode, and a second electrode formed on the interlayer insulating layer, where the second electrode is electrically connected to the first semiconductor layer. The OLED also has a thin film transistor formed in the thin film transistor region, the thin film transistor including a second semiconductor layer formed on the substrate, a gate insulating layer formed on the second semiconductor layer. The OLED also has a gate electrode formed on the gate insulating layer, a source electrode formed on the gate insulating layer, and a drain electrode formed on the gate insulating layer, and a first data line capacitor formed in the data line capacitor region, the first data line capacitor including a third semiconductor layer formed on the substrate, a gate insulating layer formed on the third semiconductor layer, an interlayer insulating layer formed on the gate insulating layer, and a data line formed on the interlayer insulating layer. The OLED also has an organic light emitting diode formed on the storage capacitor and the thin film transistor and including a pixel electrode connected to one of the source and drain electrodes, an organic emission layer formed on the pixel electrode, and an opposite electrode formed on the storage capacitor, the thin film transistor, and the first data line capacitor. The OLED also has a second data line capacitor formed on the data line capacitor, the second data line capacitor including the data line, an insulating layer formed over the data line, and the pixel electrode.

BRIEF DESCRIPTION OF THE DRAWINGS

The above and other features and advantages of certain inventive aspects are discussed with further detail with reference to the attached drawings in which.

DETAILED DESCRIPTION OF THE INVENTION

Figure 1:
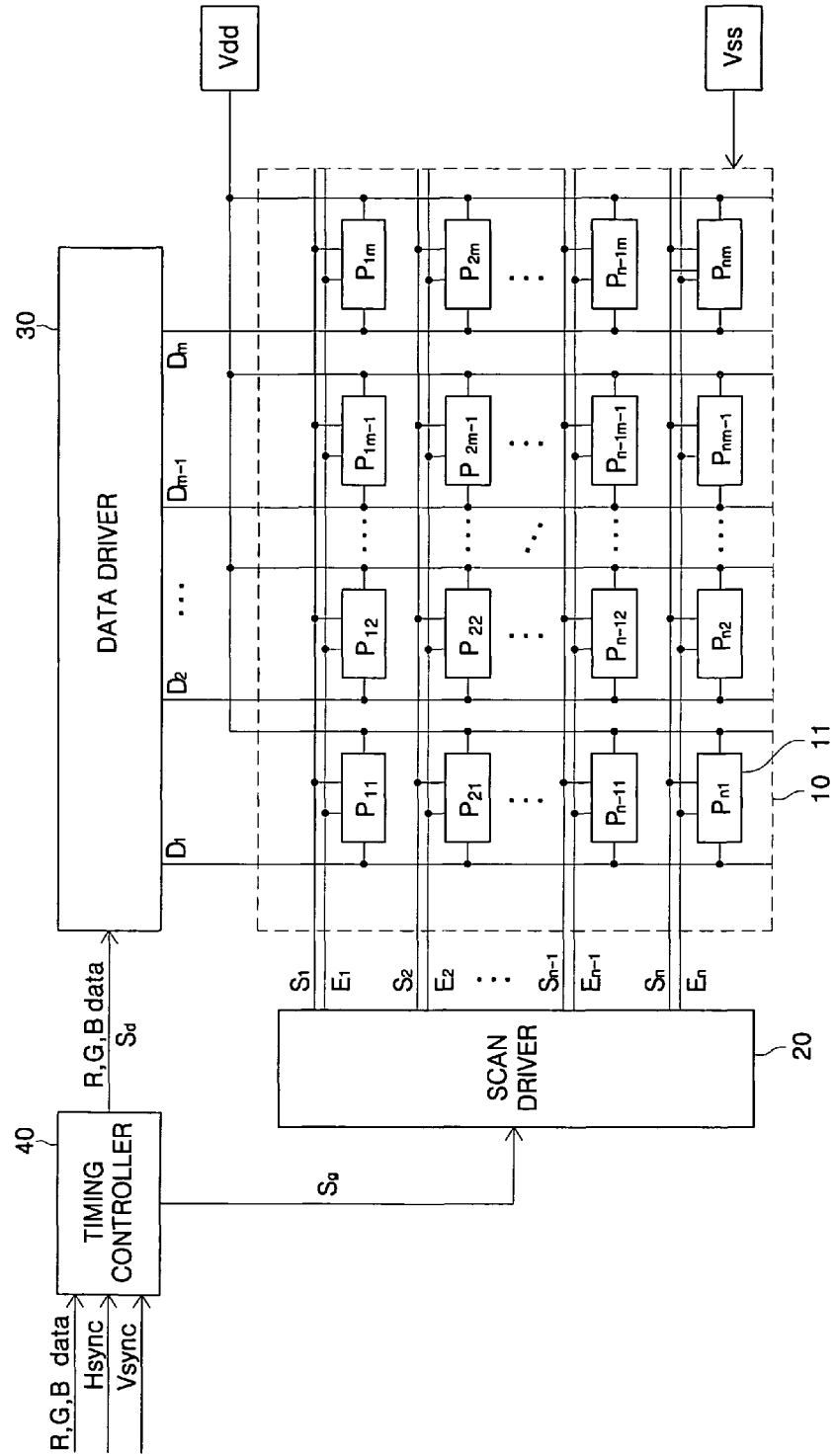
FIG. 1 is a block diagram of a conventional organic light emitting display (OLED)
Figure 2:
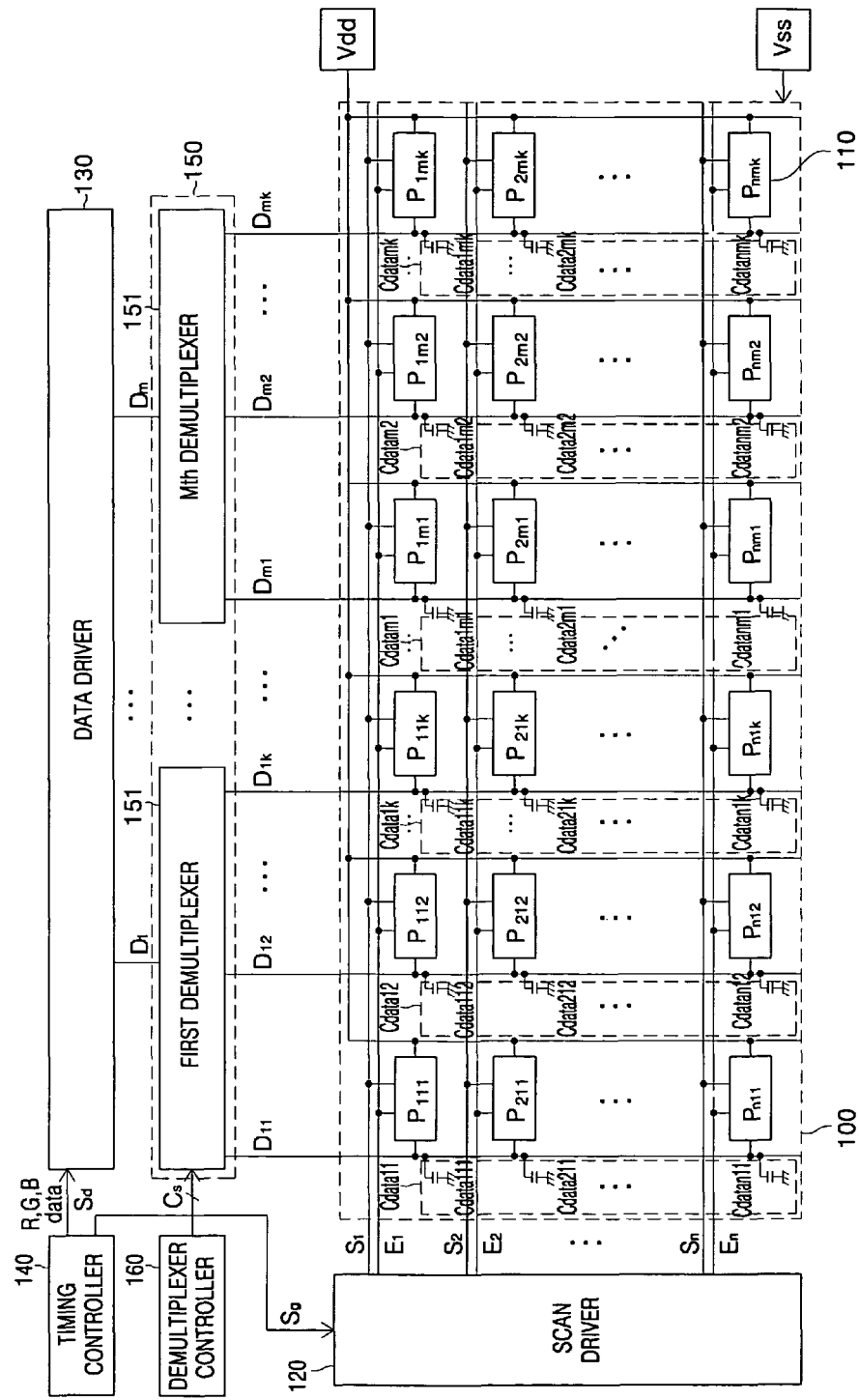
FIG. 2 is a block diagram of an OLED according to an exemplary embodiment.

FIG. 2 is a block diagram of an organic light emitting display (OLED) according to one embodiment of the present invention.

Referring to FIG. 2, the OLED includes a display panel 100, a scan driver 120, a data driver 130, a timing controller 140, a demultiplexer unit 150, and a demultiplexer controller 160.

The display panel 100 includes a plurality of pixels $P_{111}$-$P_{nmk}$ and a plurality of data line capacitors $C_{data11}$-$C_{datamk}$. The pixels $P_{111}$-$P_{nmk}$ are disposed in a region that comprises a plurality of scan lines and emission control lines $S_1$-$S_n$ and $E_1$-$E_n$ and a plurality of data lines $D_{11}$-$D_{mk}$. Also, the data line capacitors $C_{data11}$-$C_{datamk}$ are formed by the respective data lines $D_{11}$-$D_{mk}$.

Each of the pixels $P_{111}$-$P_{nmk}$ emits light corresponding to a data signal applied from one of the data lines $D_{11}$-$D_{mk}$. A pixel 110, which is representative of the pixels $P_{111}$-$P_{nmk}$, will be described later.

Also, the plurality of data line capacitors $C_{data11}$-$C_{datamk}$ are formed by each of the data lines $D_{11}$-$D_{mk}$ in order to store the data signal temporarily. For example, the data line capacitor $C_{data11}$ of the data line $D_{11}$ is formed by connecting in parallel all of the data line capacitors $C_{data111}, C_{data211}, \ldots$, and $C_{datan11}$, which are formed in the regions where the pixels $P_{111}, P_{211}, \ldots$, and $P_{n11}$ connect to the data line $D_{11}$. That is, it can be expressed that $C_{data11} = C_{data111} + C_{data211} + \ldots + C_{datan11}$.

For example, during a data writing period, when a data signal is applied to the first data line $D_{11}$ to make the first pixel $P_{111}$ emit light, the data signal is temporarily stored in the first data line capacitor $C_{data11}$ formed in the data line $D_{11}$. Next, during a scan period, once the first pixel $P_{111}$ is selected by a first scan signal $S_1$, the data voltage stored in the first data line capacitor $_{Cdata11}$ is applied to the first pixel $P_{111}$ so that the first pixel $P_{111}$ emits light corresponding to the data voltage. In other words, the data line capacitors $C_{data11}$-$C_{datamk}$ formed in each of the data lines $D_{11}$-$D_{mk}$ temporarily store the data signal applied to the data lines $D_{11}$-$D_{mk}$ and apply the stored data voltages to the pixels $P_{111}$-$P_{nmk}$ selected by the appropriate scan signal. Here, the data line capacitors $C_{data11}$-$C_{datamk}$ make use of parasitic capacitors that are formed by the data lines $D_{11}$-$D_{mk}$, an electrode, and an insulating layer interposed therebetween. Actually, the capacitance of each of the data line capacitors $C_{data11}$-$C_{datamk}$ that are equivalently formed in the data lines $D_{11}$-$D_{mk}$ may be greater than the capacitance of a storage capacitor $C_{st}$ included in each of the pixels $P_{111}$-$P_{nmk}$ in order to stably store the data signal. In some embodiments, the data line capacitors $C_{data1}$-$C_{datamk}$ have capacitance of about 20 pF to about 50 pF.

Support for the amendment can be found in originally filed claim 4.

Figure 6:
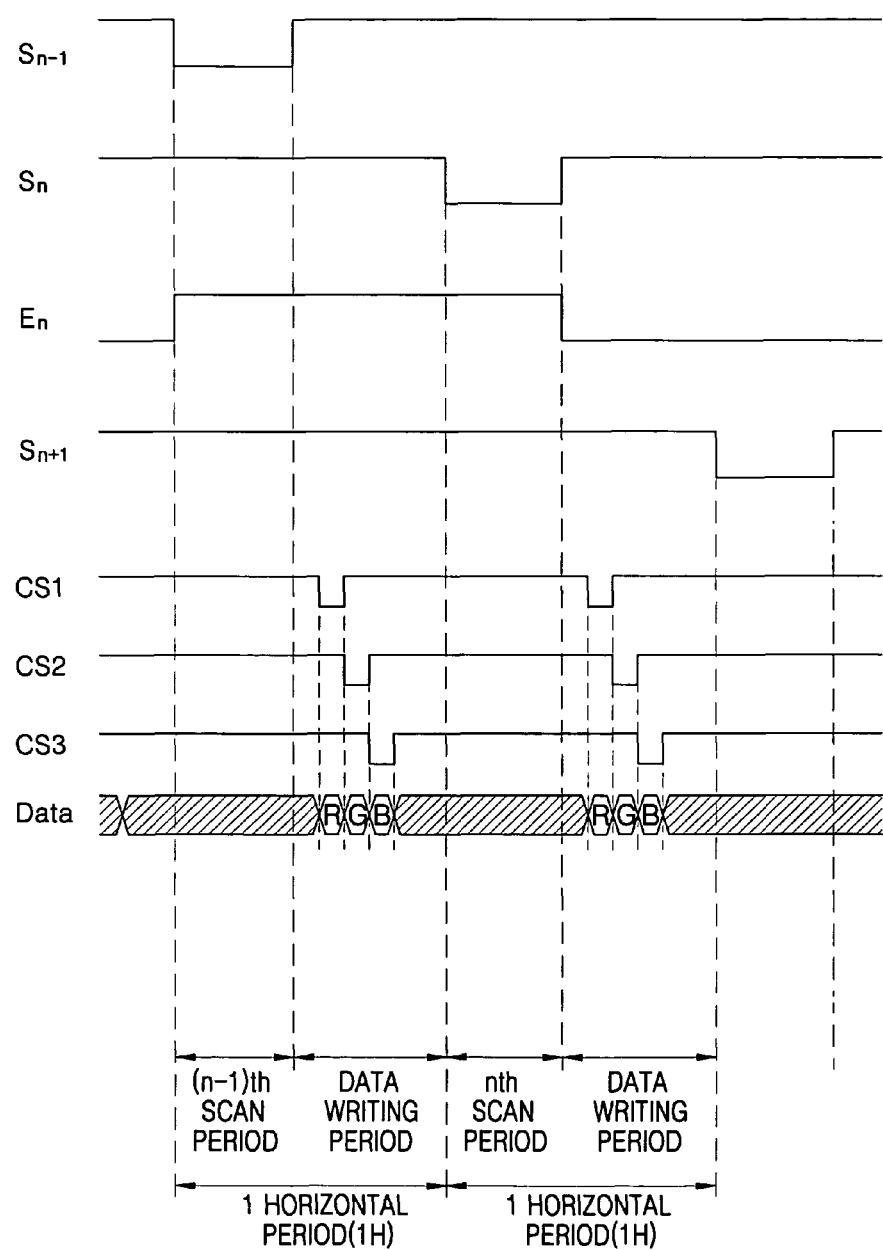
FIG. 6 is a timing diagram illustrating operations of the pixel circuit shown in FIG. 5.

The scan driver 120 generates a scan signal in response to scan control signals $S_g$ applied from the timing controller 140 and sequentially transmits the scan signal to the scan lines $S_1$-$S_n$. Here, the scan driver 120 transmits the scan signal to each scan line only during a partial period (i.e., a scan period) of one horizontal period 1H as shown in FIG. 6. More specifically, one horizontal period 1H is divided into a scan period and a data writing period. The scan driver 120 transmits a scan signal to the scan line S during the scan period of the one horizontal period 1H but does not transmit the scan signal during the data writing period. Additionally, the scan driver 120 generates an emission control signal in response to the scan control signals $S_g$ and sequentially transmits the emission control signal to the emission control lines $E_1$-$E_n$ to control the emission operation.

The data driver 130 receives R, G, and B data from the timing controller 140 and sequentially transmits R, G, B data signals to output lines $D_1$-$D_m$ in response to data control signals $S_d$. During the data writing period, the data driver 130 sequentially transmits k (k is an integral number equal to or more than 2) data signals (but, FIG. 6 illustrates only R, G, B data signals). More specifically, the data driver 130 sequentially transmits data signals (e.g., R, G, and B data), which will be supplied to corresponding pixels during a data writing period of the one horizontal period 1H. In this case, since the data signals R, G, and B, which will be supplied to the corresponding pixels, are supplied only during the data writing period, the data writing period does not overlap the scan period for which scan signals are supplied.

The timing controller 140 generates the data control signals $S_d$ and the scan control signals $S_g$ corresponding to R, G, and B data supplied from an external graphic controller (not shown) and horizontal and vertical synchronous signals. The data control signals $S_d$ and the scan control signals $S_g$, which are generated by the timing controller 140, are supplied to the data driver 130 and the scan driver 120, respectively.

The demultiplexer unit 150 includes m demultiplexers 151. Specifically, the demultiplexer unit 150 includes the demultiplexers 151 in a number equal to the number of the output lines $D_1$-$D_m$ connected to the data driver 130. The demultiplexers 151 have input terminals connected to the output lines $D_1$-$D_m$, respectively, and have output terminals connected to the m×k data lines $D_{11}$-$D_{mk}$. Each of the demultiplexers 151 drive k data signals, to the k data lines to which they are each connected. Because of the demultiplexers, the number of output lines included in the data driver 130 is sharply reduced. For example, assuming that k is 3, the number of output lines included in the data driver 130 is reduced to about ⅓ as many as in the conventional case, thus the number of data integrated circuits (ICs) included in the data driver 130 is also reduced. In the present invention, the data signals, which are supplied to one output line $D_1$, are supplied to the k data lines $D_{11}$-$D_{1k}$ using the demultiplexers 151, so that the fabrication cost of the data ICs can be greatly reduced.

The demultiplexer controller 160 transmits k control signals to control terminals of the demultiplexers 151, during the data writing period of the one horizontal period 1H, such that the k data signals are each driven onto the coreect data line of the k data lines $D_{11}$-$D_{1k}$. In this case, the k data signals, which are supplied from the demultiplexer controller 160, are sequentially supplied so as to not overlap one another during the data writing period as shown in FIG. 6. Meanwhile, although it is illustrated in FIG. 2 that the demultiplexer controller 160 is installed separate from the timing controller 140, in other embodiments the demultiplexer controller 160 may be integrated with the timing controller 140.

Figure 3:
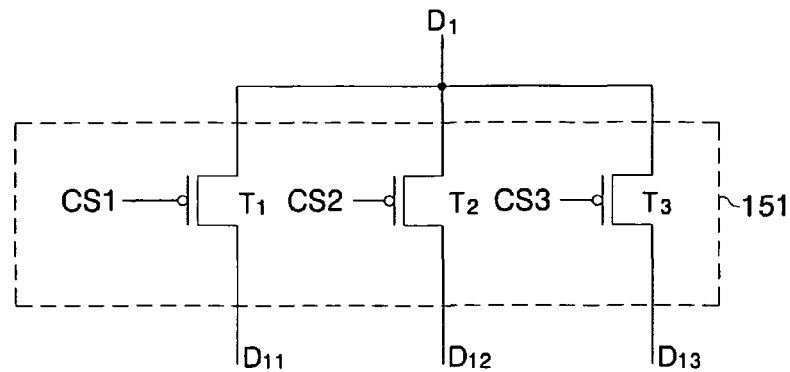
FIG. 3 is a circuit diagram of a demultiplexer shown in FIG. 2.

FIG. 3 is a circuit diagram of an embodiment of one of the demultiplexers shown in FIG. 2.

In the embodiment of FIG. 3, k is 3 for. Also, the demultiplexer shown in FIG. 3 is connected to the first output line $D_1$ of the data driver 130.

Referring to FIG. 3, the demultiplexer 151 includes a first switching device $T_1$, a second switching device $T_2$, and a third switching device $T_3$. Each of the switching devices $T_1$, $T_2$, and $T_3$ may be formed of a thin film transistor (TFT). In this embodiment, each of the switching devices $T_1$, $T_2$, and $T_3$ is formed of a p-type metal oxide semiconductor field effect transistor (MOSFET), however, in other embodiments they may be formed of an n-type MOSFET, or another type of switching element.

The first switching device $T_1$ is connected between the first output line $D_1$ and the first data line $D_{11}$. The first switching device $T_1$ is turned on when a first control signal CS1 is supplied from the demultiplexer controller 160 and transmits the data signal, which is supplied from the first output line $D_1$, to the first data line $D_{11}$. The data signal supplied to the first data line $D_1$ is stored in the first data line capacitor $C_{data11}$ during the data writing period as described above with reference to FIG. 2.

The second switching device $T_2$ is connected between the first output line $D_1$ and the second data line $D_{12}$. The second switching device $T_2$ is turned on when a second control signal CS2 is supplied from the demultiplexer controller 160 and transmits the data signal, which is supplied from the first output line $D_1$, to the second data line $D_{12}$. The data signal supplied to the second data line $D_{12}$ is stored in the second data line capacitor $C_{data12}$ during the data writing period as described above with reference to FIG. 2.

The third switching device $T_3$ is connected between the first output line $D_1$ and the third data line $D_{13}$. The third switching device $T_3$ is turned on when a third control signal CS3 is supplied from the demultiplexer controller 160 and transmits the data signal, which is supplied from the first output line $D_1$, to the third data line $D_{13}$. The data signal supplied to the third data line $D_{13}$ is stored in the third data line capacitor $C_{data13}$ during the data writing period as described above with reference to FIG. 2. The operations of the demultiplexers 151 will be described in detail later along with the construction of the pixel 110.

Figure 4:
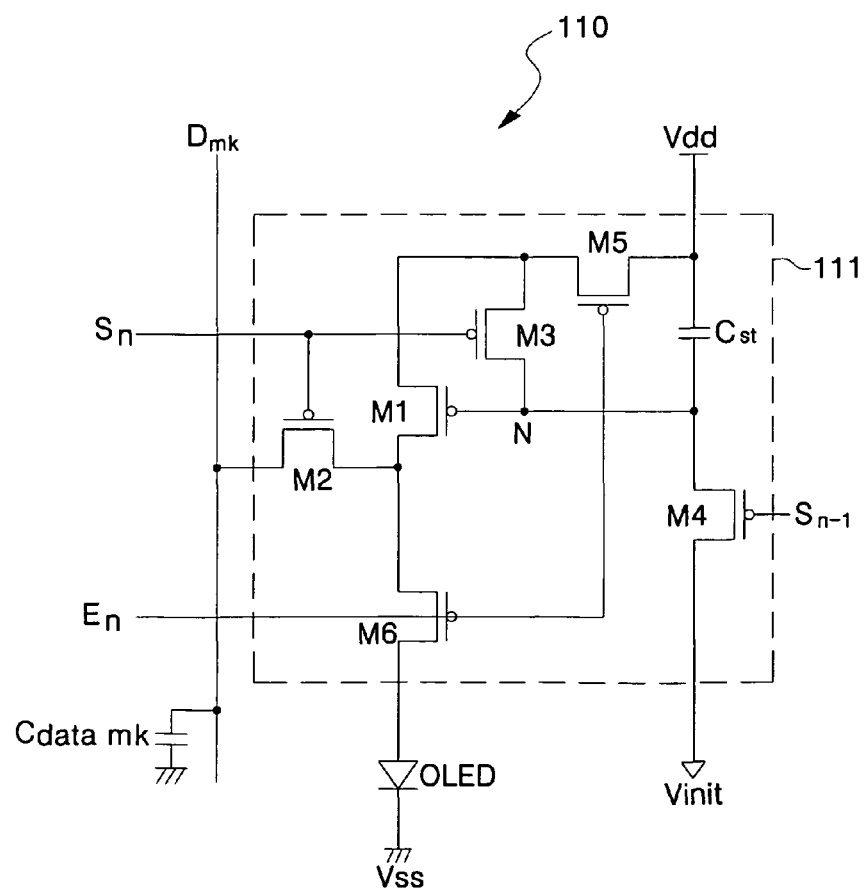
FIG. 4 is a circuit diagram of one of N×M pixels shown in FIG. 2.

FIG. 4 is a circuit diagram of one of the n×m×k pixels shown in FIG. 2. Here, a pixel according to an one embodiment is shown, but other pixels may also be used.

Referring to FIG. 4, the pixel 110 includes an organic light emitting diode OLED and a pixel driving circuit 111, which is connected to a data line $D_{mk}$, scan lines $S_n$ and $S_{n-1}$, an emission control line $E_n$, a first voltage line Vdd, and an initialization voltage line Vinit and generates a driving current for the organic light emitting diode OLED. A data line capacitor $C_{data\_mk}$ is formed in the data line $D_{mk}$ to store a data voltage for the pixel 110.

The organic light emitting diode OLED has an anode connected to the pixel driving circuit 111 and a cathode connected to a second power supply line Vss. A second power supply Vss may be a voltage lower than a first power supply Vdd, for example, a ground or negative(−) voltage. The organic light emitting diode OLED emits light corresponding to the driving current supplied from the pixel driving circuit 111.

The pixel driving circuit 111 includes a storage capacitor $C_{st}$ and six transistors M1-M6. Here, the first transistor M1 is a driving transistor, the third transistor M3 is a threshold voltage compensation transistor for diode-connecting the first transistor M1 to compensate for a threshold voltage, and the fourth transistor M4 is an initialization transistor for initializing the storage capacitor $C_{st}$. Also, the sixth transistor M6 is an emission control transistor for controlling the emission of the organic light emitting diode OLED, and the second and fifth transistors M2 and M5 are switching transistors.

The second switching transistor M2 has a gate electrode connected to an nth scan line $S_n$ and a source electrode connected to the data line $D_{mk}$. The second switching transistor M2 is turned on in response to a scan signal transmitted through the nth scan line $S_n$ and transmits a data voltage applied from the data line capacitor $C_{data\ mk}$.

The driving transistor M1 has a source electrode connected to a drain electrode of the second switching transistor M2 and a gate electrode connected to a node N. A source or drain electrode of the threshold voltage compensation transistor M3 and a first terminal of the storage capacitor $C_{st}$ are also connected to the node N, so that a gate voltage of the driving transistor M1 is the same as voltage of the node N. Thus, the driving transistor M1 generates a driving current corresponding to the voltage applied to its gate electrode.

The threshold voltage compensation transistor M3 is connected between the gate and source electrodes of the driving transistor M1 and diode-connects the driving transistor M1 in response to the scan signal transmitted through the nth scan line $S_n$. Thus, the driving transistor M1 functions as a diode in response to the scan signal so that a voltage Vdata-Vth[V] is applied to the node N and becomes the gate voltage of the driving transistor M1.

The initialization transistor M4 is connected between the initialization power supply line Vinit and the first terminal of the storage capacitor $C_{st}$. The initialization transistor M4 discharges electric charges, which are charged in the storage capacitor $C_{st}$ during the previous frame period, through the initialization power supply line Vinit in response to a scan signal supplied through the (n−1)th scan line $S_{n-1}$ connected to the gate electrode, so that the storage capacitor $C_{st}$ can be initialized.

The fifth switching transistor M5 is connected between the first power supply line Vdd and the source electrode of the driving transistor M1. The fifth switching transistor M5 is turned on in response to an emission control signal supplied through the nth emission control line $E_n$ connected to the gate electrode and supplies the first power supply Vdd to the source electrode of the driving transistor M1.

The emission control transistor M6 is connected between the driving transistor M1 and the organic light emitting diode OLED. The emission control transistor M6 transmits the driving current, which is generated by the driving transistor M1, to the organic light emitting diode OLED in response to an emission control signal supplied through the nth emission control line $E_n$ connected to the gate electrode.

The storage capacitor $C_{st}$ is connected between the first power supply line Vdd and the gate electrode of the driving transistor M1. The storage capacitor $C_{st}$ maintains electric charges so as to maintain a voltage difference between the first power supply Vdd and the voltage Vdata-Vth[V] applied to the gate electrode of the driving transistor M1, during one frame period.

Although it is illustrated in FIG. 4 that each of the transistors M1-M6 is a p-type MOSFET, each of the transistors M1-M6 can instead be designed as an N-type MOSFET.

Figure 5:
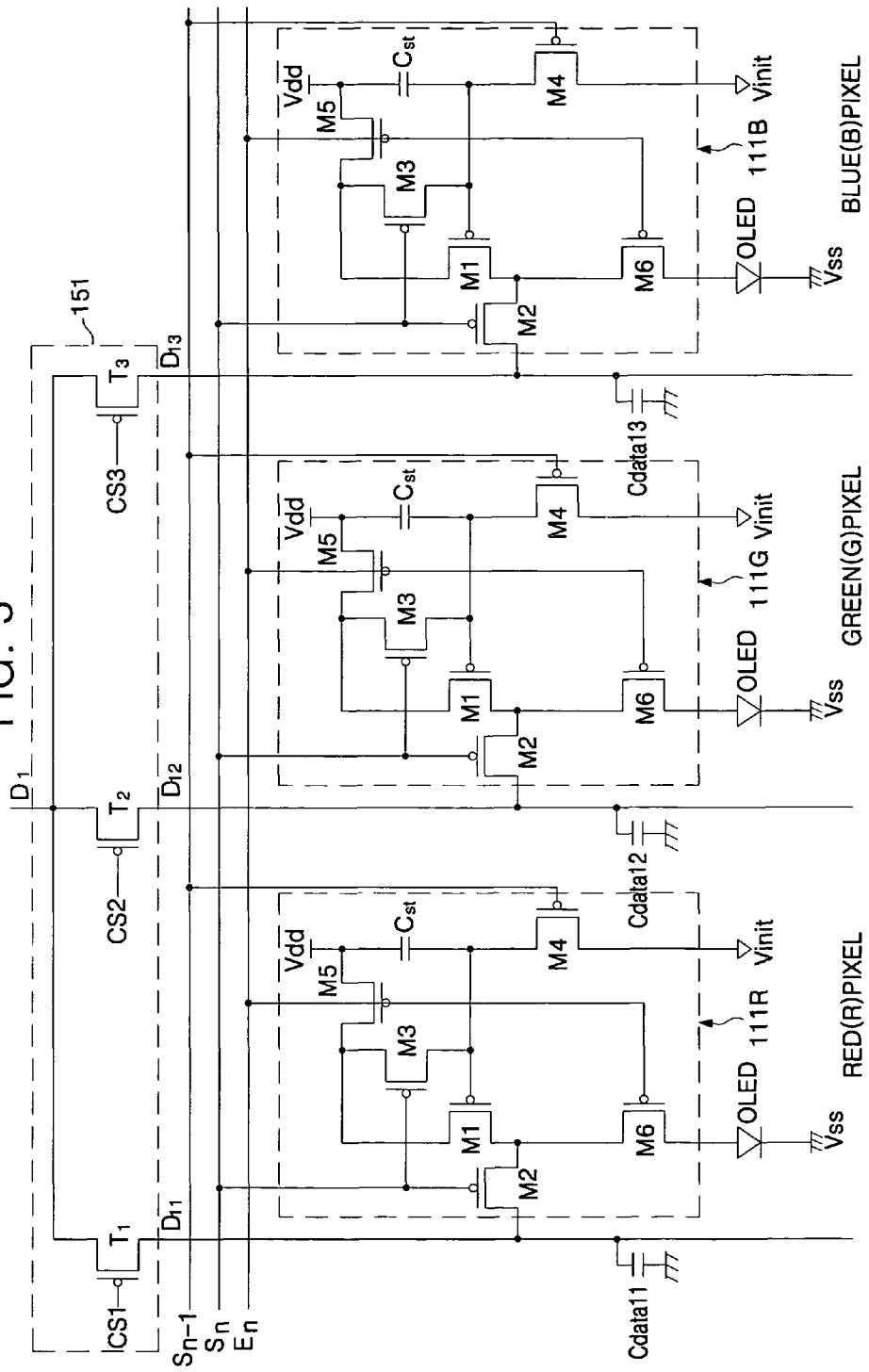
FIG. 5 is a detailed circuit diagram showing connection of the demultiplexer to the pixels shown in FIG. 2.

FIG. 5 is a detailed circuit diagram showing the connection of the demultiplexer with the pixels shown in FIG. 2, and FIG. 6 is a timing diagram illustrating operations of a pixel circuit shown in FIG. 5. Here, red(R), green(G), and blue(B) pixels are connected to the demultiplexers 151 which is connected to the first output line D1 (i.e., k=3).

Referring to FIGS. 5 and 6, a low-level scan signal is applied to the (n−1)th scan line $S_{n-1}$ during an (n−1)th scan period of one horizontal period 1H. Once the scan signal is applied to the (n−1)th scan line $S_{n-1}$, the initialization transistor M4, which is included in each of the R, G, and B pixels, is turned on. When the initialization transistor M4 is turned on, one terminal of the storage capacitor $C_{st}$ and a gate terminal of the driving transistor M1 are connected to the initialization power supply line Vinit. That is, when the scan signal is applied to the (n−1)th scan line $S_{n-1}$, a data voltage of the previous frame stored in the storage capacitor $C_{st}$ of each of the R, G, and B pixels, i.e., the gate voltage of the driving transistor M1, is initialized. When the scan signal is applied to the (n−1)th scan line $S_{n-1}$, the first switching transistor M2 connected to the nth scan line $S_n$ remains turned off.

Thereafter, the first switching device $T_1$, the second switching device $T_2$, and the third switching device $T_3$ are sequentially turned on in response to the first through third control signals CS1, CS2, and CS3 that are sequentially supplied during the data writing period. Initially, when the first switching device $T_1$ is turned on in response to the first control signal CS1, an R data signal supplied to the first output line $D_1$ is applied to the first data line $D_{11}$. In this case, the first data line capacitor $C_{data11}$ is charged with a voltage corresponding to the R data signal applied to the first data line $D_{11}$. Next, the second switching device $T_2$ is turned on in response to the second control signal CS2, thus a G data signal supplied to the first output line D1 is applied to the second data line $D_{12}$. In this case, the second data line capacitor $C_{data12}$ is charged with a voltage corresponding to the G data signal applied to the second data line $D_{12}$. Finally, the third switching device $T_3$ is turned on in response to the third control signal CS3, thus a B data signal supplied to the first output line $D_1$ is applied to the third data line $D_{13}$. In this case, the third data line capacitor $C_{data13}$ is charged with a voltage corresponding to the B data signal applied to the third data line $D_{13}$. Meanwhile, since no scan signal is applied to the nth scan line $S_n$ during the data writing period, the R, G, and B data signals are not supplied to the R, G, and B pixels.

Thereafter, a low-level scan signal is applied to the nth scan line $S_n$ during an nth scan period that follows the data writing period. Once the scan signal is applied to the nth scan line $S_n$, the first switching transistor M2 and the threshold voltage compensation transistor M3 which are included in each of the R, G, and B pixels are turned on. The first switching transistor M2 of each of the R, G, and B pixels transmits a voltage Vdata corresponding to the R, G, and B data signals, which are stored in the first through third data line capacitors $C_{data11}$-$C_{data13}$ in the data writing period, to the R, G, and B pixels. The threshold voltage compensation transistor M3 serves to diode-connect the driving transistor M1. That is, a voltage Vdata-Vth$_{M1}$[V] corresponding to a difference between the voltage Vdata corresponding to the R, G, and B data signals stored in the first through third data line capacitors $C_{data11}$-$C_{data13}$ and a threshold voltage Vth of the driving transistor M1 is applied to the gate terminal of the driving transistor M1 and one terminal of the storage capacitor $C_{st}$ through the diode-connected driving transistor M1.

Thereafter, a low-level emission control signal is applied to the emission control line En. Thus, both the fifth switching transistor M5 and the emission control transistor M6 are turned on, so that a driving current corresponding to the first power supply Vdd applied to the source terminal of the driving transistor M1 and the voltage Vdata-Vth$_{M1}$ applied to its gate terminal is supplied to the organic light emitting diode OLED through the emission control transistor M6. Thus, the organic light emitting diode OLED emits light with a luminance corresponding to the data.

In this case, the driving current supplied to the organic light emitting diode OLED can be expressed as Equation 1:

$$I_{OLED} = K(Vgs_{M1} - Vth_{M1})^2 = K(Vdd - Vdata + Vth_{M1} - Vth_{M1})^2 = K(Vdd - Vdata)^2 \quad (1)$$

where $I_{OLED}$ is the current that flows through the organic light emitting diode OLED, $Vgs_{M1}$ is the voltage between the source and gate electrodes of the first transistor M1, $Vth_{M1}$ is the threshold voltage of the first transistor M1, Vdata is the data voltage, Vdd is the first voltage, and K is a constant.

As can be seen from Equation 1, the driving current corresponding to the first power supply voltage Vdd and the R, G, and B data voltages Vdata stored in the data line capacitors $C_{data11}$, $C_{data12}$, and $C_{data13}$ of the data lines D11, D12, and D13 flows through the organic light emitting diode OLED irrespective of the threshold voltage $Vth_{M1}$ of the driving transistor M1. In other words, a pixel according to an exemplary embodiment of the present invention detects a variance of the threshold voltage $Vth_{M1}$ of the driving transistor M1 using the threshold voltage compensation transistor M3 and compensates for the variance on its own, thereby improving the non-uniformity of luminance resulting from the variance of the threshold voltage $Vth_{M1}$.

Accordingly, the OLED is advantageous in supplying R, G, and B data signals, which are sequentially applied to the first output line D1, to the k data lines $D_{11}$-$D_{1k}$ using the demultiplexers 151. Also, voltages corresponding to data signals are stored in the data line capacitors $C_{data11}$-$C_{data1k}$ during the data writing period, and the voltages stored in the data line capacitors $C_{data11}$-$C_{data1k}$ are applied to pixels during the scan period. Since the voltages stored in the data line capacitors $C_{data11}$-$C_{data1k}$ are simultaneously applied to the respective pixels, i.e., since the respective data signals are supplied at the same point in time, an image with uniform luminance can be displayed.

However, as one horizontal period 1H is divided into the scan period and the data writing period, the data line capacitor $C_{datamk}$ and the storage capacitor $C_{st}$ included in each of the pixels, which are separated during the data writing period, are connected to each other during the scan period. Thus, electric charges equivalent to the data voltage Vdata stored in the data line capacitor $C_{datamk}$ are shared between the capacitors $C_{datamk}$ and $C_{st}$, so that the gate voltage VgM1 of the driving transistor M1 is substantially given by:

$$VgM1 = \frac{Cdata \cdot Vdata + Csts(Vinit - Vdd)}{(Cdata + Cst)} \quad (2)$$

where $Vg_{M1}$ is the gate voltage of the driving transistor M1, Vdata is the data voltage, Vinit is the initialization voltage, Vdd is the first power supply, $C_{data}$ is the data line capacitor, and $C_{st}$ is the storage capacitor included in each of the pixels.

As can be seen from Equation 2, there may be a difference between the gate voltage $Vg_{M1}$ of the driving transistor M1 and the data voltage Vdata applied according to the capacitances of the data line capacitor $C_{data}$ and the storage capacitor $C_{st}$ included in each of the pixels. Because of the difference between the applied data voltage Vdata and the gate voltage $Vg_{M1}$, the luminance of the OLED may become non-uniform.

Figure 7:
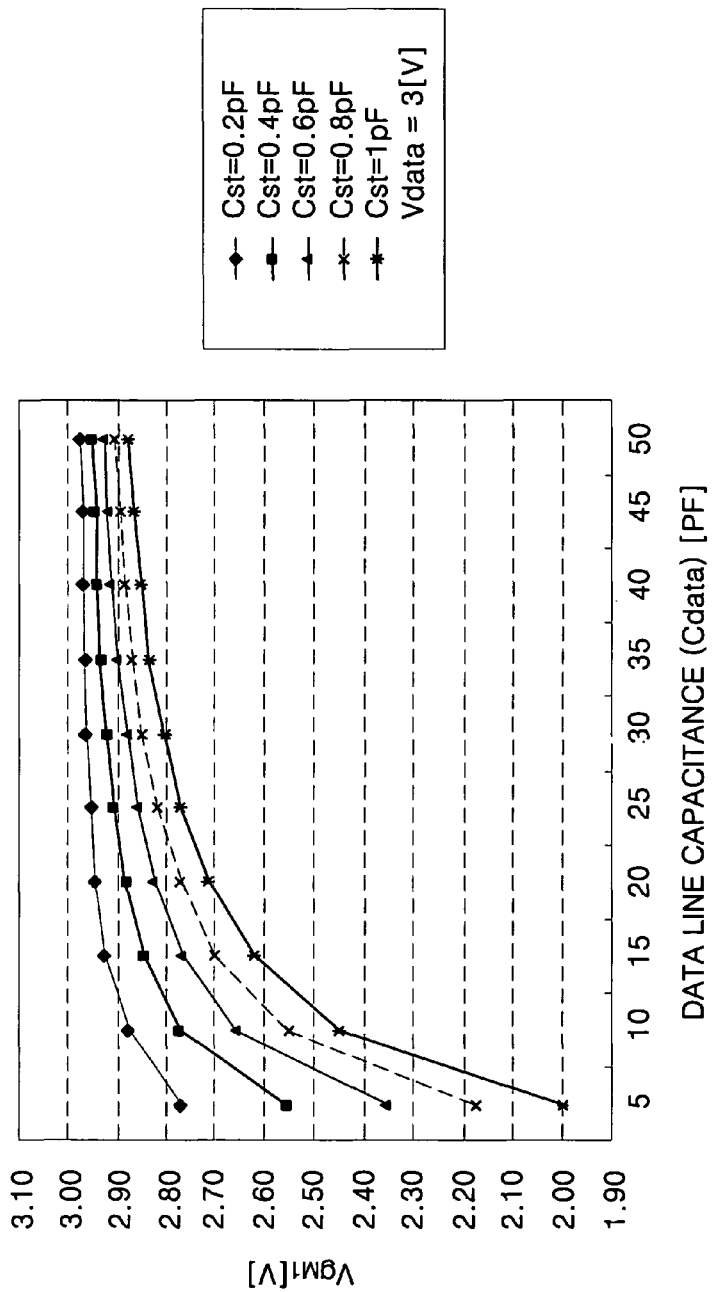
FIG. 7 is a graph of simulation results showing gate voltages of a driving transistor versus capacitances of a data line capacitor and a storage capacitor of a pixel in the OLED.

FIG. 7 is a graph of simulation results showing gate voltages of a driving transistor versus capacitances of a data line capacitor and a storage capacitor of a pixel. In FIG. 7, it is assumed that the data voltage Vdata applied to each pixel of FIG. 5 is 3 [V].

Referring to FIG. 7, the simulation results were obtained by measuring the gate voltage $Vg_{M1}$ of the driving transistor M1 while setting the capacitance of the storage capacitor $C_{st}$ included in the pixel to 0.2, 0.4, 0.6, 0.8, and 1[PF] and varying the capacitance of the data line capacitor $C_{data}$ from 5 to 50[PF].

In applying a data voltage Vdata of 3[V] to the data line, when the capacitance of the data line capacitor $C_{data}$ was 5[PF], the gate voltage $Vg_{M1}$ of the driving transistor M1 was 2, 2.35, and 2.75[V] when the capacitance of the storage capacitor $C_{st}$ included in the pixel was 1, 0.6, and 0.2[PF], respectively.

However, as the capacitance of the data line capacitor $C_{data}$ was increased to 20[PF], the gate voltage $Vg_{M1}$ of the driving transistor M1 was 2.7, 2.85, and 2.94[V] when the capacitance of the storage capacitor $C_{st}$ included in the pixel was 1, 0.6, and 0.2[PF], respectively. That is, the gate voltage $Vg_{M1}$ of the driving transistor M1 was generally increased higher than when the capacitance of the data line capacitor $C_{data}$ was 5[PF].

Also, as the capacitance of the data line capacitor $C_{data}$ was increased to 50[PF], the gate voltage $Vg_{M1}$ of the driving transistor M1 was 2.89, 2.93, and 2.98[V] when the capacitance of the storage capacitor $C_{st}$ included in the pixel was 1, 0.6, and 0.2[PF], respectively. That is, the gate voltage $Vg_{M1}$ of the driving transistor M1 was generally increased higher than when the capacitance of the data line capacitor $C_{data}$ was 20[PF]. Accordingly, based on the simulation results of FIG. 7, it can be concluded that when the data line capacitor $C_{data}$ has much greater capacitance than the storage capacitor $C_{st}$ of the pixel, the gate voltage $Vg_{M1}$ of the driving transistor M1 is equal or close to the applied data voltage Vdata. That is, in the pixel to which the data voltage Vdata is applied using the demultiplexer of FIG. 5 according to the timing diagram of FIG. 6, the capacitance of the data line capacitor $C_{data}$ may be about 20 to 50[PF]. In this case, the applied data voltage Vdata becomes almost equal to the gate voltage $Vg_{M1}$ of the driving transistor M1 so that the OLED has uniform luminance.

Processes of fabricating pixels for substantially elevating the capacitance of the data line capacitor $C_{data}$ to 20 to 50[PF] will now be described with reference to cross-sectional views of FIGS. 8 through 11.

Figure 8:
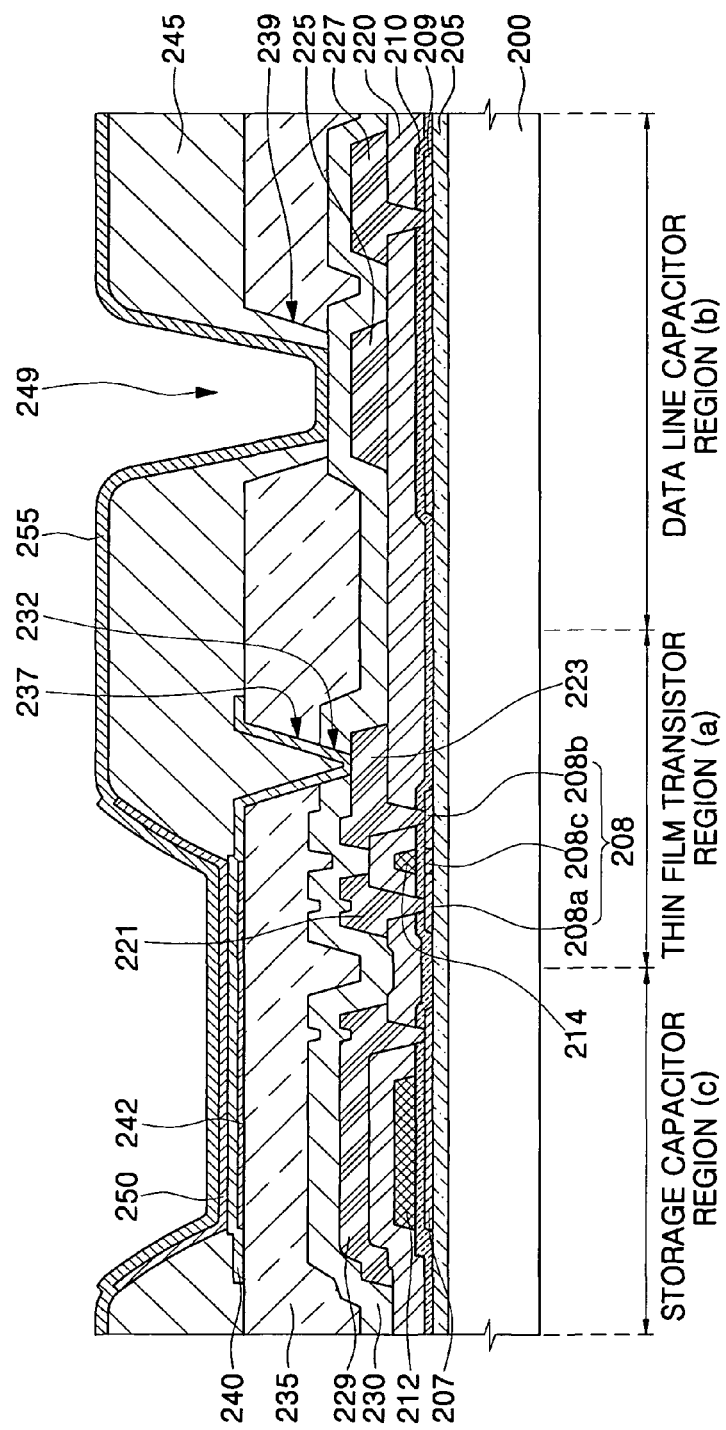
FIG. 8 is a cross-sectional view of a pixel having a structure to increase the capacitance of a data line capacitor according to one embodiment.

FIG. 8 is a cross-sectional view of a pixel having a structure to increase the capacitance of a data line capacitor according to one embodiment. In FIG. 8, a pixel region is divided into 3 regions, i.e., a TFT region (a), a data line capacitor region (b), and a storage capacitor region (c). The TFT region (a) supplies a driving current to an organic light emitting diode. The data line capacitor region (b) receives a data voltage during the data writing period and temporarily stores the data voltage. Also, the storage capacitor region (c) stores the data voltage for a predetermined time during an nth scan period.

Referring to FIG. 8, a substrate 200 is prepared to form the pixel region according to one embodiment. The substrate 200 may be a transparent or opaque substrate. Also, the substrate 200 may comprise at least one of glass, plastic, quartz, silicon and metal.

A buffer layer 205 may be formed on the substrate 200. The buffer layer 205 may comprise at least one of a silicon oxide ($SiO_2$) layer, a silicon nitride ($SiN_x$) layer, a silicon oxynitride ($SiO_2N_x$) layer, and a multi-layer thereof.

First through third semiconductor layers 207, 208, and 209 are patterned on the buffer layer 205. That is, the first semiconductor layer 207 is patterned in the storage capacitor region (c), the second semiconductor layer 208 is patterned in the TFT region (a), and the third semiconductor layer 209 is patterned in the data line capacitor region (b). The first through third semiconductor layers 207, 208, and 209 may be amorphous silicon (a-Si) layers or polysilicon silicon (poly-Si) layers obtained by crystallizing the a-Si layers. In some embodiments, the first through third semiconductor layers 207, 208, and 209 are poly-Si layers having high charge mobility.

A gate insulating layer 210 is formed over the entire surface of the substrate 200 including the first through third semiconductor layers 207, 208, and 209. The gate insulating layer 210 may comprise at least one of a silicon oxide ($SiO_2$) layer, a silicon nitride ($SiN_x$) layer, a silicon oxynitride ($SiO_2N_x$) layer, and a multi-layer thereof.

A first electrode 212 of a storage capacitor $C_{st}$ is formed on the gate insulating layer 210 in the storage capacitor region (c) to overlap the first semiconductor layer 207, and a gate electrode 214 is formed on the TFT region (a) to overlap the second semiconductor layer 208. In this case, while the first electrode 212 and the gate electrode 214 are being formed, scan lines ($S_{n-1}$, $S_n$, and $E_n$ of FIG. 4) can be formed at the same time.

Thereafter, dopants ($n^+$ or $p^+$ type) are implanted into the second semiconductor layer 208 in the TFT region (a) using the gate electrode 214 as a mask. Thus, source and drain regions 208a and 208b are formed in regions that do not overlap the gate electrode 214 formed on the second semiconductor layer 208. In this case, a channel region 208c is defined between the source and drain regions 208a and 208b.

An interlayer insulating layer 220 is formed over the entire surface of the substrate 200 including the first electrode 212 and the gate electrode 214. Contact holes are formed in the interlayer insulating layer 220 and the gate insulating layer 210 to expose the first through third semiconductor layers 207, 208, and 209. A conductive layer is formed on the substrate 200 including the contact holes and then patterned, thereby forming source and drain electrodes 221 and 223 in the TFT region (a). Then, a data line 225 and a metal 227 which applies a reference voltage to the third semiconductor layer 209, are formed in the data line capacitor region (b). Also, a second electrode 229, which comes into contact with the first semiconductor layer 207, is formed in the storage capacitor region (c).

Here, the second semiconductor layer 208, the gate insulating layer 210, the gate electrode 214, the source electrode 221, and the drain electrode 223 are formed in the TFT region (a) to produce a TFT. The TFT may be, for example, a driving transistor (M1 of FIG. 4), which generates a driving current, or an emission control transistor (M6 of FIG. 4), which supplies the driving current to the organic light emitting diode OLED.

Also, the first semiconductor layer 207, the gate insulating layer 210, the first electrode 212, the interlayer insulating layer 220, and the second electrode 229 which is in contact with the first semiconductor layer 207, are formed in the storage capacitor region (c) to produce a storage capacitor $C_{st}$.

Further, the third semiconductor layer 209, the gate insulating layer 210, the interlayer insulating layer 220, the data line 225 are formed in the data line capacitor region (b) to produce a first data line capacitor $C_{data1}$.

A passivation layer 230 is formed over the entire surface of the substrate 200 including the electrodes 221, 223, 225, 227, and 229 that are formed by patterning the conductive layer. The passivation layer 230 may comprise at least one of a silicon oxide ($SiO_2$) layer, a silicon nitride ($SiN_x$) layer, and a multi-layer thereof. In some embodiments the passivation layer 230 is formed of a silicon nitride ($SiN_x$) layer, which effectively protects the underlying TFT from gas or moisture and may be hydrogen-rich to protect incomplete bonding existing in grain boundaries of the poly-Si layer.

A first via hole 232 is formed in the passivation layer 230 to expose the drain electrode 223 of the TFT.

A planarization layer 235 is formed on the passivation layer 230 to reduce the step height, and may comprise at least one of an organic layer, such as a benzocyclobutene (BCB) layer, a polyimide layer, and a polyacryl layer.

A second via hole 237 and a third via hole 239 are formed in the planarization layer 235. The second via hole 237 exposes the drain electrode 223 of the TFT in the TFT region (a), and the third via hole 239 exposes the passivation layer 230 formed on the data line 225 in the data line capacitor region (b).

A pixel electrode 240 is formed on the planarization layer 235 having the second via hole 237 in the storage capacitor region (c) and the TFT region (a). The pixel electrode 240 is in contact with the drain electrode 223 that is exposed by the second via hole 237 in the TFT region (a). Also, since the pixel shown in FIG. 8 is a top-emitting type, the pixel electrode 240 may be formed of a light-reflecting conductive layer. The light-reflecting conductive layer may comprise at least one of Ag, Al, Ni, Pt, Pd, and an alloy thereof having a high work function. The light-reflecting conductive layer may comprise at least one of Mg, Ca, Al, Ag, Ba, or an alloy thereof having a low work function. In some embodiments, before the pixel electrode 240 is formed, a reflective layer pattern 242 may be further formed, and then the pixel electrode 240 may be formed thereon using a light-transmitting conductive layer. The light-transmitting conductive layer may comprise at least one of an indium tin oxide (ITO) and indium zinc oxide (IZO) layer. In some embodiments the reflective layer pattern 242 has a reflectivity of 60% or higher and comprises at least one of Al, an Al alloy, Ag, an Ag alloy, and an alloy thereof. This reflective layer pattern 242 may be formed spaced apart from the second via hole 237 by a predetermined distance.

A pixel defining layer (PDL) 245 is formed over the entire surface of the substrate 200 including the pixel electrode 240. The PDL 245 may comprise at least one of BCB, acrylic photoresist, phenolic photoresist, and imidic photoresist.

An opening 247 and a fourth via hole 249 are formed in the PDL 245. The opening 247 exposes at least a portion (emission region) of the pixel electrode 240 and the fifth via hole 249 exposes the passivation layer 230 formed on the data line 225 in the data line capacitor region (b).

An organic emission layer 250 is formed on the region of the pixel electrode 240 that is exposed by the opening. The organic emission layer 250 may be formed by a vacuum deposition process, an inkjet printing process, or a laser induced thermal imaging (LITI) process. Further, a hole injection layer, a hole transport layer, a hole blocking layer, an electron transport layer, or an electron injection layer may be formed on or under the organic emission layer 250. Subsequently, an opposite electrode 255 is formed on the entire surface of the substrate 200 including the organic emission layer 250 and the PDL 245. The opposite electrode 255 may comprise at least one of a light-transmitting conductive layer and a metal reflective layer. The light-transmitting conductive layer may be an ITO or IZO layer or formed of Mg, Ca, Al, Ag, Ba, or an alloy thereof to such a small thickness as to transmit light.

In the storage capacitor region (c) and the TFT region (a), the pixel electrode 240, the organic emission layer 250, and the opposite electrode 255 constitute an organic light emitting diode OLED. Also, the data line 225, the passivation layer 230, and the opposite electrode 255 form a second data line capacitor $C_{data2}$ in the data line capacitor region (b).

While the organic light emitting diode operates, holes and electrons (or electrons and holes) are emitted from the pixel electrode 240 and the opposite electrode 255, respectively, and injected into the organic emission layer 250. The holes and electrons combine with each other in the organic emission layer 250, thus generating excitons. As the excitons are changed from an excited state to a ground state, the organic emission layer 250 emits light. The light emitted from the organic emission layer 250 is reflected by the pixel electrode 240 formed of a light-reflecting conductive layer or the reflective layer pattern 242 disposed under the pixel electrode 240 formed of a light-transmitting conductive layer, and passes through the opposite electrode 255 formed of the light-transmitting layer to be emitted to the exterior.

As described above, the pixel according one embodiment includes the first data line capacitor $C_{data1}$ obtained by forming the third semiconductor layer 209 under the data line 225. Also, the planarization layer 235 and the PDL 245 are etched through the third and/or fourth via holes 239 and/or 249 in the data line capacitor region (b), so that the opposite electrode 255 and the data line 225 form the second data line capacitor $C_{data}2$ using only the passivation layer 230 as a dielectric layer.

Accordingly, the data line capacitor $C_{data}$ has a structure to which the first and second data line capacitors $C_{data1}$ and $C_{data2}$ are connected in parallel about the data line 225. That is, $C_{data}=C_{data1}+C_{data2}$. In applying the pixel structure according to one embodiment, the data line capacitor $C_{data}$ has a capacitance of 20 to 50[PF], which is about 16 times more than in the conventional pixel structure. Therefore, when the pixel driving method using the demultiplexers is applied according that described above, the gate voltage Vg of the driving transistor becomes substantially equal to the applied data voltage Vdata, so that the OLED can display improved gray scale and have substantially uniform luminance.

The capacitance of the data line capacitor $C_{data}$ may be adjusted by controlling the size of a via hole formed in an insulating layer, such as a passivation layer, a planarization layer, or a PDL and the size of a contact hole via which a semiconductor layer is in contact with a metal.

Figure 9:
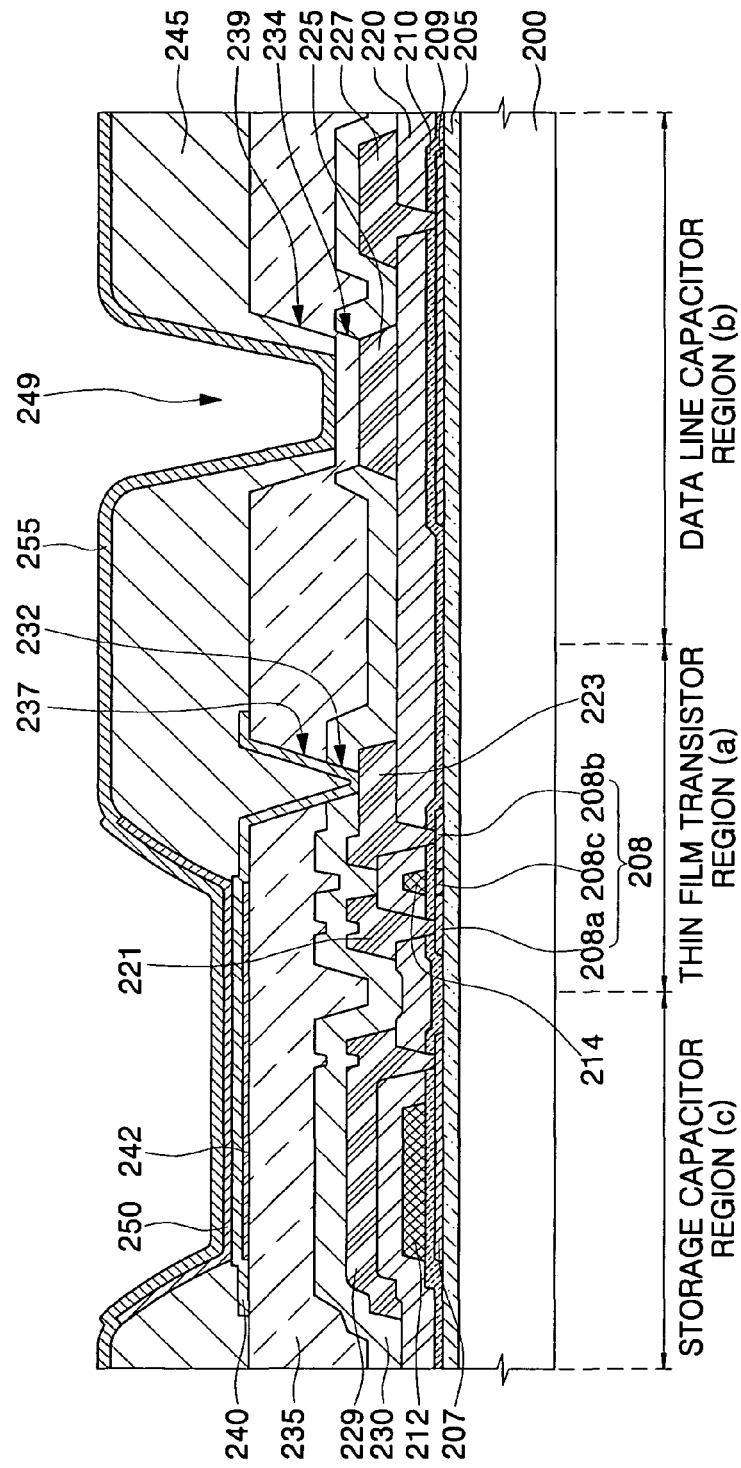
FIG. 9 is a cross-sectional view of a pixel having a structure to increase the capacitance of a data line capacitor according to another embodiment.

FIG. 9 is a cross-sectional view of a pixel having a structure to increase the capacitance of a data line capacitor according to another embodiment. In FIG. 9, a pixel region is divided into 3 regions, i.e., a TFT region (a), a data line capacitor region (b), and a storage capacitor region (c) like in FIG. 8. Here, the same processes as described with reference to FIG. 8 will be briefly described, but different processes will be described in detail.

Referring to FIG. 9, a substrate 200 is prepared to form a pixel region. A buffer layer 205 may be formed on the substrate 200.

First through third semiconductor layers 207, 208, and 209 are patterned over the buffer layer 205. That is, the first semiconductor layer 207 is patterned in the storage capacitor region (c), the second semiconductor layer 208 is patterned in the TFT region (a), and the third semiconductor layer 209 is patterned in the data line capacitor region (b).

A gate insulating layer 210 is formed over the entire surface of the substrate 200 including the first through third semiconductor layers 207, 208, and 209. The gate insulating layer 210 may comprise at least one of a silicon oxide ($SiO_2$) layer, a silicon nitride ($SiN_x$) layer, a silicon oxynitride ($SiO_2N_x$) layer, and a multi-layer thereof.

A first electrode 212 of a storage capacitor $C_{st}$ is formed on the gate insulating layer 210 in the storage capacitor region (c) to overlap the first semiconductor layer 207, and a gate electrode 214 is formed in the TFT region (a) to overlap the second semiconductor layer 208. In this case, while the first electrode 212 and the gate electrode 214 are being formed, scan lines ($S_{n-1}$, $S_n$, and En of FIG. 4) may also be formed at the same time.

Thereafter, dopants ($n^+$ or $p^+$ type) are implanted into the second semiconductor layer 208 in the TFT region (a) using the gate electrode 214 as a mask. Thus, source and drain regions 208a and 208b are formed in regions that do not overlap the gate electrode 214 formed on the second semiconductor layer 208. In this case, a channel region 208c is defined between the source and drain regions 208a and 208b.

An interlayer insulating layer 220 is formed over the entire surface of the substrate 200 including the first electrode 212 and the gate electrode 214. Contact holes are formed in the interlayer insulating layer 220 and the gate insulating layer 210 to expose the first through third semiconductor layers 207, 208, and 209. A conductive layer is formed over the substrate 200 including the contact holes and then patterned, thereby forming source and drain electrodes 221 and 223 in the TFT region (a). Then, a data line 225 and a metal 227, which applies a reference voltage to the third semiconductor layer 209, are formed in the data line capacitor region (b). Also, a second electrode 229, which comes into contact with the first semiconductor layer 207, is formed in the storage capacitor region (c).

Here, the second semiconductor layer 208, the gate insulating layer 210, the gate electrode 214, the source electrode 221, and the drain electrode 223 are formed in the TFT region (a) to produce a TFT. The TFT may, for example be a driving transistor (M1 of FIG. 4), which generates a driving current, or an emission control transistor (M6 of FIG. 4), which supplies the driving current to the organic light emitting diode OLED.

Also, the first semiconductor layer 207, the gate insulating layer 210, the first electrode 212, the interlayer insulating layer 220, and the second electrode 229 which is in contact with the first semiconductor layer 207, are formed in the storage capacitor region (c) to form storage capacitor $C_{st}$.

Further, the third semiconductor layer 209, the gate insulating layer 210, the interlayer insulating layer 220, the data line 225 are stacked in the data line capacitor region (b) to form a first data line capacitor $C_{data1}$.

A passivation layer 230 is formed over the entire surface of the substrate 200 including the electrodes 221, 223, 225, 227, and 229 that are formed by patterning the conductive layer. The passivation layer 230 may comprise at least one of a silicon oxide ($SiO_2$) layer, a silicon nitride ($SiN_x$) layer, and a multi-layer thereof. Also, in some embodiments the passivation layer 230 may not be formed.

A first via hole 232 and a second via hole 234 are formed in the passivation layer 230. The first via hole 232 exposes the drain electrode 223 of the TFT, and the second via hole 234 exposes the data line 225.

A planarization layer 235 is formed on the passivation layer 230 to reduce the step height, and may be formed of an organic layer. A third via hole 237 is formed in the planarization layer 235 in the TFT region (a) to expose the drain electrode 223 in a region where the first via hole 232 is formed. Also, a fourth via hole 239 is formed in the planarization layer 235 formed on the data line 225.

A pixel electrode 240 is formed on the planarization layer 235 having the third via hole 237 in the storage capacitor region (c) and the TFT region (a). The pixel electrode 240 is in contact with the drain electrode 223 that is exposed by the third via hole 237 in the TFT region (a). Additionally, since the pixel shown in FIG. 9 is a top-emitting type, the pixel electrode 240 may be formed of a light-reflecting conductive layer. In another embodiment, before the pixel electrode 240 is formed, a reflective layer pattern 242 may be further formed, and then the pixel electrode 240 may be formed using a light-transmitting conductive layer. This reflective layer pattern 242 may be spaced apart from the third via hole 237 by a predetermined distance.

A PDL 245 is formed on the entire surface of the substrate 200 including the pixel electrode 240. An opening 247 and a fifth via hole 249 are formed in the PDL 245. The opening 247 exposes at least a portion (emission region) of the pixel electrode 240, and the fifth via hole 249 exposes the partially etched planarization layer 235 on the data line 225.

An organic emission layer 250 is formed on the pixel electrode 240 that is exposed by the opening 247. Subsequently, an opposite electrode 255 is formed on the entire surface of the substrate 200 including the organic emission layer 250 and the PDL 245. The opposite electrode 255 may comprise at least one of a light-transmitting conductive layer and a metal reflective layer.

In the storage capacitor region (c) and the TFT region (a), the pixel electrode 240, the organic emission layer 250, and the opposite electrode 255 form an organic light emitting diode. Also, the data line 225, the planarization layer 235, and the opposite electrode 255 form a second data line capacitor $C_{data2}$ in the data line capacitor region (b).

As described above, in the pixel according to one embodiment, the first data line capacitor $C_{data1}$ is produced by forming the third semiconductor layer 209 under the data line 225. Also, the passivation layer 230, the planarization layer 235, and the PDL 245 are etched through the second, fourth, and fifth via holes 234, 239 and 249 in the data line capacitor region (b), so that the opposite electrode 255 and the data line 225 constitute the second data line capacitor $C_{data2}$ using only the planarization layer 235 as a dielectric layer.

Accordingly, the data line capacitor $C_{data}$ has a structure to which the first and second data line capacitors $C_{data1}$ and $C_{data2}$ are connected in parallel about the data line 225. That is, $C_{data}=C_{data1}+C_{data2}$. In applying the pixel structure according to the second embodiment of the present invention, the data line capacitor $C_{data}$ has a capacitance of 20 to 50[PF], which is about 16 times more than in the conventional pixel structure. Therefore, when the pixel driving method using the demultiplexers is used, the gate voltage Vg of a driving transistor becomes substantially equal to the applied data voltage Vdata, so that the OLED can display exact gray scale and have uniform luminance.

The capacitance of the data line capacitor $C_{data}$ may be adjusted by controlling the size of a via hole formed in an insulating layer, such as a passivation layer, a planarization layer, or a PDL and the size of a contact hole via which a semiconductor layer is in contact with a metal layer.

Figure 10:
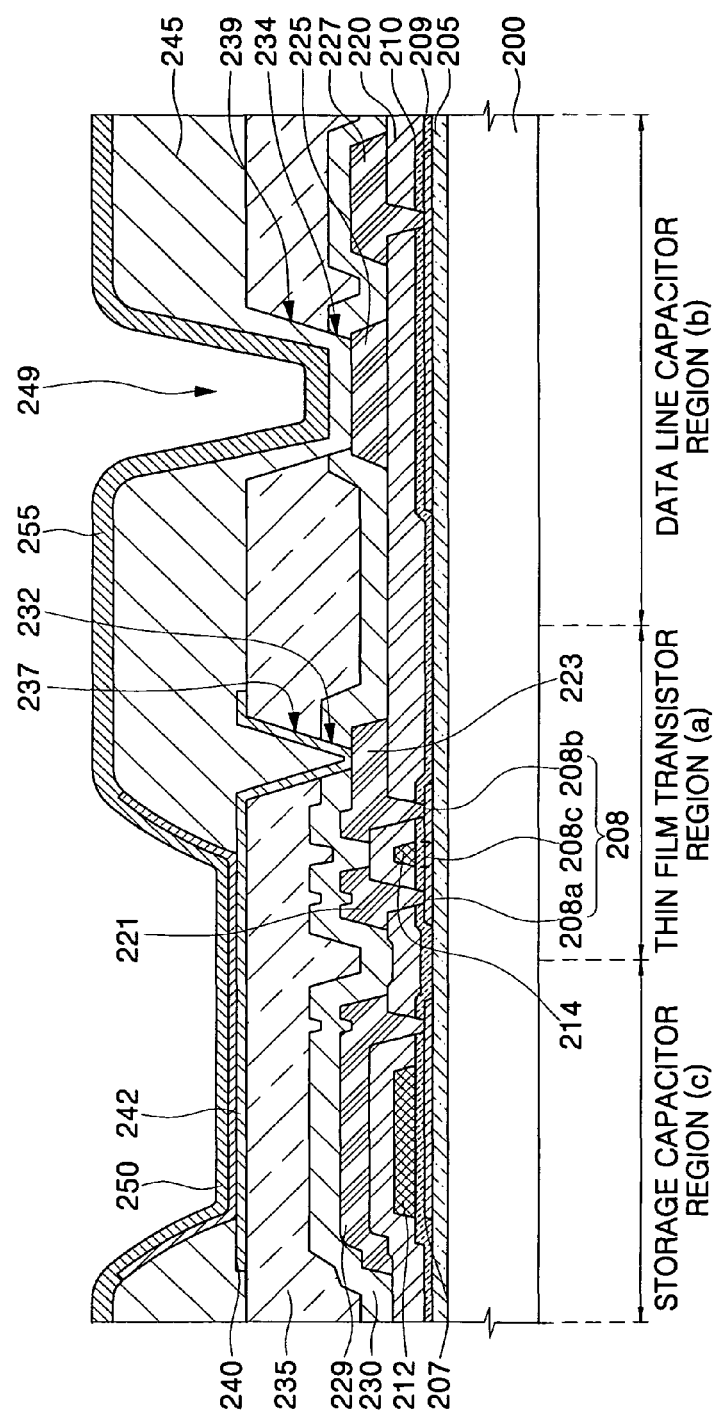
FIG. 10 is a cross-sectional view of a pixel having a structure to increase the capacitance of a data line capacitor according to yet another embodiment.

FIG. 10 is a cross-sectional view of a pixel having a structure to increase the capacitance of a data line capacitor according to yet another embodiment. In FIG. 10, a pixel region is divided into 3 regions, i.e., a TFT region (a), a data line capacitor region (b), and a storage capacitor region (c) like in FIG. 8. Here, the same processes as described with reference to FIG. 8 will be briefly described, but different processes will be described in detail.

Referring to FIG. 10, to form a pixel region according to this embodiment, a substrate 200 is prepared. A buffer layer 205 may be formed on the substrate 200.

First through third semiconductor layers 207, 208, and 209 are patterned over the buffer layer 205. That is, the first semiconductor layer 207 is patterned in the storage capacitor region (c), the second semiconductor layer 208 is patterned in the TFT region (a), and the third semiconductor layer 209 is patterned in the data line capacitor region (b).

A gate insulating layer 210 is formed on the entire surface of the substrate 200 including the first through third semiconductor layers 207, 208, and 209. The gate insulating layer 210 may comprise at least one of a silicon oxide ($SiO_2$) layer, a silicon nitride ($SiN_x$) layer, a silicon oxynitride ($SiO_2N_x$) layer, and a multi-layer thereof.

A first electrode 212 of a storage capacitor $C_{st}$ is formed on the gate insulating layer 210 in the storage capacitor region (c) to overlap the first semiconductor layer 207, and a gate electrode 214 is formed in the TFT region (a) to overlap the second semiconductor layer 208. In this case, while the first electrode 212 and the gate electrode 214 are being formed, scan lines ($S_{n-1}$, $S_n$, and $E_n$ of FIG. 4) may be formed at the same time.

Thereafter, dopants ($n^+$ or $p^+$ type) are implanted into the second semiconductor layer 208 in the TFT region (a) using the gate electrode 214 as a mask. Thus, source and drain regions 208a and 208b are formed in regions that do not overlap the gate electrode 214 formed on the second semiconductor layer 208. In this case, a channel region 208c is defined between the source and drain regions 208a and 208b.

An interlayer insulating layer 220 is formed over the entire surface of the substrate 200 including the first electrode 212 and the gate electrode 214. Contact holes are formed in the interlayer insulating layer 220 and the gate insulating layer 210 to expose the first through third semiconductor layers 207, 208, and 209. A conductive layer is formed over the substrate 200 including the contact holes and then patterned, thereby forming source and drain electrodes 221 and 223 in the TFT region (a). Then, a data line 225 and a metal 227, which applies a reference voltage to the third semiconductor layer 209, are formed in the data line capacitor region (b). Also, a second electrode 229, which comes into contact with the first semiconductor layer 207, is formed in the storage capacitor region (c).

Here, the second semiconductor layer 208, the gate insulating layer 210, the gate electrode 214, the source electrode 221, and the drain electrode 223 are stacked in the TFT region (a) to form a TFT. The TFT may, for example, be a driving transistor (M1 of FIG. 4), which generates a driving current, or an emission control transistor (M6 of FIG. 4), which supplies the driving current to the organic light emitting diode OLED. Also, the first semiconductor layer 207, the gate insulating layer 210, the first electrode 212, the interlayer insulating layer 220, and the second electrode 229, which is in contact with the first semiconductor layer 207, are formed such that they overlap in the storage capacitor region (c) to form a storage capacitor $C_{st}$. Further, the third semiconductor layer 209, the gate insulating layer 210, the interlayer insulating layer 220, the data line 225 are formed such that they overlap in the data line capacitor region (b) to form a first data line capacitor $C_{data1}$.

A passivation layer 230 is formed over the entire surface of the substrate 200 including the electrodes 221, 223, 225, 227, and 229 that are formed by patterning the conductive layer. The passivation layer 230 may comprise at least one of a silicon oxide ($SiO_2$) layer, a silicon nitride ($SiN_x$) layer, and a multi-layer thereof. Also, in some embodiments the passivation layer 230 may not be formed. A first via hole 232 and a second via hole 234 are formed in the passivation layer 230. The first via hole 232 exposes the drain electrode 223 of the TFT, and the second via hole 234 exposes the data line 225.

A planarization layer 235 is formed on the passivation layer 230 to reduce the step height, and may be formed of an organic layer, such as a BCB layer, a polyimide layer, or a polyacryl layer. A third via hole 237 is formed in the planarization layer 235 in the TFT region (a) to expose the drain electrode 223 in a region where the first via hole 232 is formed. Also, a fourth via hole 239 is formed to expose the data line 225.

A pixel electrode 240 is formed on the planarization layer 235 having the third via hole 237 in the storage capacitor region (c) and the TFT region (a). The pixel electrode 240 is in contact with the drain electrode 223 that is exposed by the third via hole 237 in the TFT region (a). Additionally, since the pixel shown in FIG. 10 is a top-emitting type, the pixel electrode 240 may be formed of a light-reflecting conductive layer. In another embodiment, before the pixel electrode 240 is formed, a reflective layer pattern 242 may be further formed, and then the pixel electrode 240 may be formed using a light-transmitting conductive layer. This reflective layer pattern 242 may be spaced apart from the third via hole 237 by a predetermined distance.

A PDL 245 is formed on the entire surface of the substrate 200 including the pixel electrode 240. An opening 247 and a fifth via hole 249 are formed in the PDL 245. The opening 247 exposes at least a portion (emission region) of the pixel electrode 240, and a portion of the PDL 245 is etched by the fifth via hole 249 on the data line 225.

An organic emission layer 250 is formed on the pixel electrode 240 that is exposed by the opening 247. Subsequently, an opposite electrode 255 is formed on the entire surface of the substrate 200 including the organic emission layer 250 and the PDL 245. The opposite electrode 255 may comprise at least one of a light-transmitting conductive layer and a metal reflective layer.

In the storage capacitor region (c) and the TFT region (a), the pixel electrode 240, the organic emission layer 250, and the opposite electrode 255 form an organic light emitting diode. Also, the data line 225, the planarization layer 235, and the opposite electrode 255 form a second data line capacitor $C_{data2}$ in the data line capacitor region (b).

As described above, the pixel according to one embodiment, the first data line capacitor $C_{data1}$ is produced by forming the third semiconductor layer 209 under the data line 225. Also, the passivation layer 230, the planarization layer 235, and the PDL 245 are etched through the second, fourth, and fifth via holes 234, 239 and 249 in the data line capacitor region (b), and the opposite electrode 255 and the data line 225 constitute the second data line capacitor $C_{data\ 2}$ using only the PDL 245 as a dielectric layer.

Accordingly, the data line capacitor $C_{data}$ has a structure to which the first and second data line capacitors $C_{data1}$ and $C_{data2}$ are connected in parallel about the data line 225. That is, $C_{data} = C_{data1} + C_{data2}$. In applying the pixel structure according to the third embodiment of the present invention, the data line capacitor $C_{data}$ has a capacitance of 20 to 50[PF], which is about 16 times more than in the conventional pixel structure. Therefore, when the pixel driving method using the demultiplexers is used, the gate voltage Vg of a driving transistor becomes substantially equal to the applied data voltage Vdata, so that the OLED can display exact gray scale and have uniform luminance.

The capacitance of the data line capacitor $C_{data}$ may be adjusted by controlling the size of a via hole formed in an insulating layer, such as a passivation layer, a planarization layer, or a PDL and the size of a contact hole via which a semiconductor layer is in contact with a metal layer.

Figure 11:
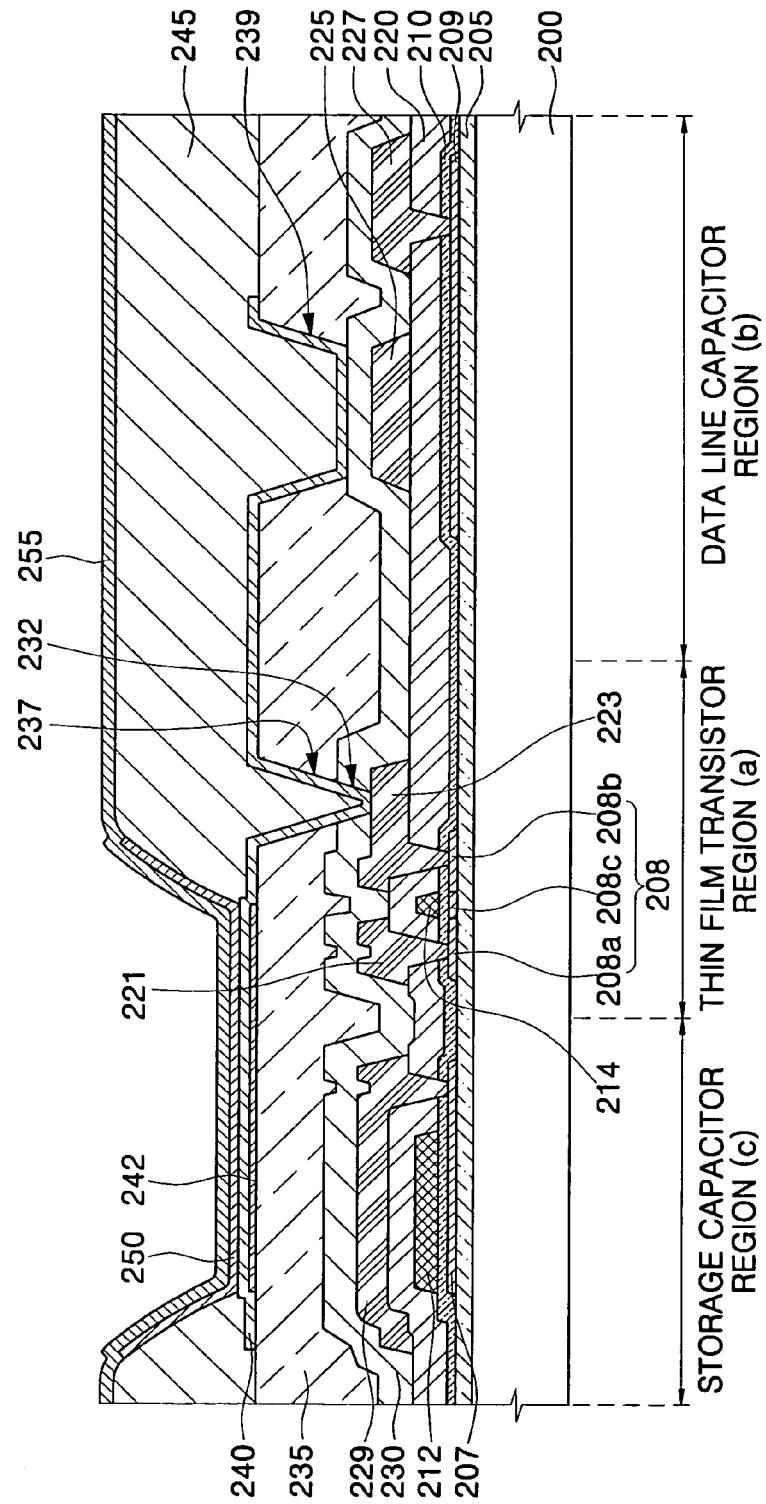
FIG. 11 is a cross-sectional view of a pixel having a structure to increase the capacitance of a data line capacitor according to still another embodiment.

FIG. 11 is a cross-sectional view of a pixel having a structure to increase the capacitance of a data line capacitor according to yet another embodiment. In FIG. 11, a pixel region is divided into 3 regions, i.e., a TFT region (a), a data line capacitor region (b), and a storage capacitor region (c) like in FIG. 8. Here, the same processes as described with reference to FIG. 8 will be briefly described, but different processes will be described in detail.

Referring to FIG. 11, to form a pixel region according to this embodiment, a substrate 200 is prepared. A buffer layer 205 may be formed on the substrate 200.

First through third semiconductor layers 207, 208, and 209 are patterned on the buffer layer 205. That is, the first semiconductor layer 207 is patterned in the storage capacitor region (c), the second semiconductor layer 208 is patterned in the TFT region (a), and the third semiconductor layer 209 is patterned in the data line capacitor region (b).

A gate insulating layer 210 is formed over the entire surface of the substrate 200 including the first through third semiconductor layers 207, 208, and 209. The gate insulating layer 210 may comprise at least one of a silicon oxide ($SiO_2$) layer, a silicon nitride ($SiN_x$) layer, a silicon oxynitride ($SiO_2N_x$) layer, and a multi-layer thereof.

A first electrode 212 of a storage capacitor $C_{st}$ is formed on the gate insulating layer 210 in the storage capacitor region (c) to overlap the first semiconductor layer 207, and a gate electrode 214 is formed in the TFT region (a) to overlap the second semiconductor layer 208. In this case, while the first electrode 212 and the gate electrode 214 are being formed, scan lines ($S_{n-1}$, $S_n$, and $E_n$ of FIG. 4) may also be formed at the same time.

Thereafter, dopants ($n^+$ or $p^+$ type) are implanted into the second semiconductor layer 208 in the TFT region (a) using the gate electrode 214 as a mask. Thus, source and drain regions 208a and 208b are formed in regions that do not overlap the gate electrode 214 formed on the second semiconductor layer 208. In this case, a channel region 208c is defined between the source and drain regions 208a and 208b.

An interlayer insulating layer 220 is formed over the entire surface of the substrate 200 including the first electrode 212 and the gate electrode 214. Contact holes are formed in the interlayer insulating layer 220 and the gate insulating layer 210 to expose the first through third semiconductor layers 207, 208, and 209. A conductive layer is formed over the substrate 200 including the contact holes and then patterned, thereby forming source and drain electrodes 221 and 223 in the TFT region (a). Then, a data line 225 and a metal 227, which applies a reference voltage to the third semiconductor layer 209, are formed in the data line capacitor region (b). Also, a second electrode 229, which comes into contact with the first semiconductor layer 207, is formed in the storage capacitor region (c).

Here, the second semiconductor layer 208, the gate insulating layer 210, the gate electrode 214, the source electrode 221, and the drain electrode 223 are formed in the TFT region (a) to produce a TFT. The TFT may, for example, be a driving transistor (M1 of FIG. 4), which generates a driving current, or an emission control transistor (M6 of FIG. 4), which supplies the driving current to the organic light emitting diode OLED.

Also, the first semiconductor layer 207, the gate insulating layer 210, the first electrode 212, the interlayer insulating layer 220, and the second electrode 229, which is in contact with the first semiconductor layer 207, are formed in the storage capacitor region (c) to form a storage capacitor $C_{st}$. Further, the third semiconductor layer 209, the gate insulating layer 210, the interlayer insulating layer 220, the data line 225 are stacked in the data line capacitor region (b) to form a first data line capacitor $C_{data1}$.

A passivation layer 230 is formed over the entire surface of the substrate 200 including the electrodes 221, 223, 225, 227, and 229 that are formed by patterning the conductive layer. The passivation layer 230 may comprise at least one of a silicon oxide ($SiO_2$) layer, a silicon nitride ($SiN_x$) layer, and a multi-layer thereof. Also, in some embodiments, the passivation layer 230 may not be formed. A first via hole 232 is formed in the passivation layer 230 to expose the drain electrode 223 of the TFT.

A planarization layer 235 is formed on the passivation layer 230 to reduce the step height, and may be formed of an organic layer, such as a BCB layer, a polyimide layer, or a polyacryl layer. A second via hole 237 is formed in the planarization layer 235 in the TFT region (a) to expose the drain electrode 223 in a region where the first via hole 232 is formed. Also, a third via hole 239 is formed to expose the passivation layer 230.

A pixel electrode 240 is formed over the entire surface of the substrate 200 including the planarization layer 235 in which the second via hole 237 and the third via hole 239 are formed. The pixel electrode 240 is in contact with the drain electrode 223 that is exposed by the second via hole 237. Also, the pixel electrode 240 is formed over the passivation layer 230 that is exposed by the third via hole 239. Further, the pixel electrode 240 may be formed over the planarization layer 235 if the passivation layer 230 is not formed. Additionally, since the pixel shown in FIG. 11 is a top-emitting type, the pixel electrode 240 may be formed of a light-reflecting conductive layer. In another embodiment, before the pixel electrode 240 is formed, a reflective layer pattern 242 may be further formed, and then the pixel electrode 240 may be formed using a light-transmitting conductive layer. This reflective layer pattern 242 may be spaced apart from the second via hole 237 by a predetermined distance.

A PDL 245 is formed on the entire surface of the substrate 200 including the pixel electrode 240. An opening 247 is formed in the PDL 245 to expose at least a portion (emission region) of the pixel electrode 240.

An organic emission layer 250 is formed on the pixel electrode 240 that is exposed by the opening 247. Subsequently, an opposite electrode 255 is formed on the entire surface of the substrate 200 including the organic emission layer 250 and the PDL 245. The opposite electrode 255 may comprise at least one of a light-transmitting conductive layer and a metal reflective layer.

In the storage capacitor region (c) and the TFT region (a), the pixel electrode 240, the organic emission layer 250, and the opposite electrode 255 form an organic light emitting diode. Also, the data line 225, the passivation layer 230 (and/or the planarization layer 235), and the opposite electrode 255 form a second data line capacitor $C_{data2}$ in the data line capacitor region (b).

As described above, the pixel according to one embodiment, the first data line capacitor $C_{data1}$ is obtained by forming the third semiconductor layer 209 under the data line 225. Also, the passivation layer 230 and/or the planarization layer 235 are etched through the third via hole 239 in the data line capacitor region (b), and the pixel electrode 240 and the data line 225 constitute the second data line capacitor $C_{data2}$ using only the passivation layer 230 and/or the planarization layer 235 as a dielectric layer.

Accordingly, the data line capacitor $C_{data}$ has a structure to which the first and second data line capacitors $C_{data1}$ and $C_{data2}$ are connected in parallel about the data line 225. That is, $C_{data}=C_{data1}+C_{data2}$. In applying the pixel structure according to the fourth embodiment of the present invention, the data line capacitor $C_{data}$ has a capacitance of 20 to 50[PF], which is about 16 times more than in the conventional pixel structure. Therefore, when the pixel driving method using the demultiplexers is used, the gate voltage Vg of a driving transistor becomes substantially equal to the applied data voltage Vdata, so that the OLED can display exact gray scale and have uniform luminance.

The capacitance of the data line capacitor $C_{data}$ may be selected by controlling the size of a via hole formed in an insulating layer, such as a passivation layer, a planarization layer, or a PDL and the size of a contact hole via which a semiconductor layer is in contact with a metal layer.

Figure 12:
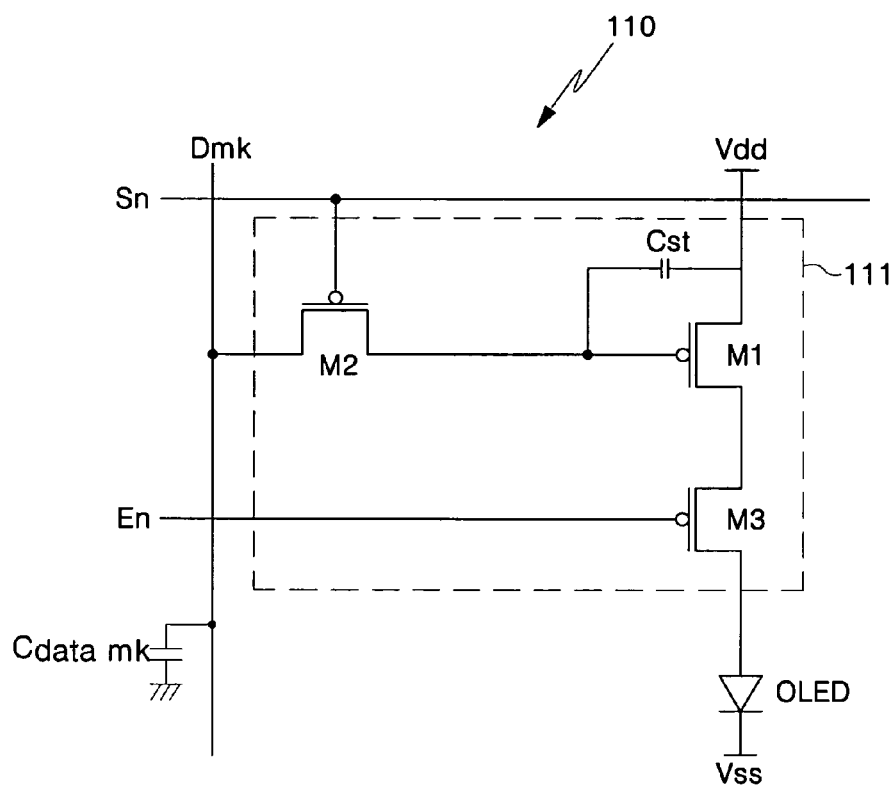
FIG. 12 is a circuit diagram of another pixel of the OLED shown in FIG. 2.

FIG. 12 is a circuit diagram of another pixel of the OLED shown in FIG. 2.

Referring to FIG. 12, a pixel 110 includes an organic light emitting diode OLED, which emits light according to a driving current, and a pixel driving circuit 111, which supplies the driving current to the organic light emitting diode OLED. A data voltage Vdata, which is stored in a data line capacitor $C_{datamk}$ during a data writing period, is applied to the pixel driving circuit 111.

The pixel driving circuit 111 includes a driving transistor M1, a switching transistor M2, an emission control transistor M3, and a storage capacitor $C_{st}$. The switching transistor M2 is turned on or off in response to a selection signal applied to a scan line $S_n$ connected to a gate terminal and transmits the data voltage Vdata from a data line $D_{mk}$. The driving transistor M1 is connected between a first voltage line Vdd and the emission control transistor M3 and has a gate terminal connected to a drain of the switching transistor M2 to generate a driving current corresponding to the data voltage Vdata. The storage capacitor $C_{st}$ is connected between the first voltage line Vdd and the gate terminal of the driving transistor M1 and maintains the data voltage Vdata for a predetermined time. The emission control transistor M3 is connected between the driving transistor M1 and the organic light emitting diode OLED to transmit the driving current to the organic light emitting diode OLED in response to an emission control signal of an emission control line $E_n$ connected to the gate terminal.

Operations of the pixel shown in FIG. 12 will now be described. Initially, the data voltage Vdata is stored in the data line capacitor $C_{datamk}$ during a data writing period. Next, when a selection signal is applied to the scan line $S_n$, the switching transistor M2 is turned on. In this state, the data voltage Vdata stored in the data line capacitor $C_{datamk}$ is applied to the gate terminal of the driving transistor M1 via the switching transistor M2, and electric charges equivalent to a difference between a first voltage Vdd and the data voltage Vdata are stored in the storage capacitor $C_{st}$. The driving transistor M1 operates as a constant current source due to the first voltage Vdd applied to a source and the voltage Vdata applied to a gate and supplies the driving current to the organic light emitting diode OLED.

In this case, the current supplied to the organic light emitting diode OLED can be expressed as Equation 3:

$$I_{OLED}=k(Vgs-Vth)^2=k(Vdd-Vdata-Vth)^2 \quad (3)$$

where $I_{OLED}$ is the current supplied to the organic light emitting diode OLED, Vgs is the voltage between the source and gate of the driving transistor M1, Vth is the threshold voltage of the driving transistor M1, Vdata is the data voltage, and k is a constant.

Figure 13:
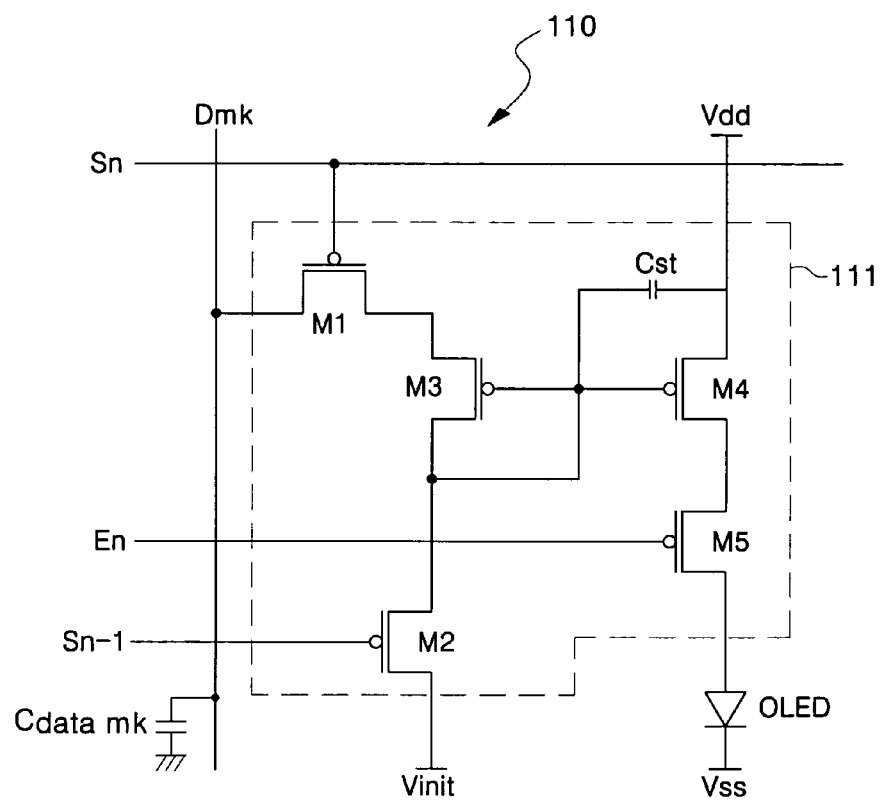
FIG. 13 is a circuit diagram of yet another pixel of the OLED shown in FIG. 2.

FIG. 13 is a circuit diagram of yet another pixel of the OLED shown in FIG. 2.

Referring to FIG. 13, a pixel 110 includes an organic light emitting diode OLED, which emits light according to a driving current, and a pixel driving circuit 111, which supplies the driving current to the organic light emitting diode OLED. A data voltage Vdata, which is stored in a data line capacitor $C_{datamk}$ during a data writing period, is applied to the pixel driving circuit 111.

The pixel driving circuit 111 includes first through fifth TFTs M1-M5 and a storage capacitor $C_{st}$. Here, the first transistor M1 is a switching transistor, and the fourth transistor M4 is a driving transistor. Also, the second transistor M2 is an initialization transistor, and the third transistor M3 is a compensation transistor, which compensates a threshold voltage of the driving transistor M4. Specifically, the first transistor M1 turns on or off in response to a selection signal applied to an nth scan line $S_n$ connected to a gate terminal thereof and transmits or passes the data voltage Vdata from a data line $D_{mk}$ to the third transistor M3. The second transistor M2 is turned on in response to a selection signal applied to an (n−1)th scan line $S_{n-1}$ connected to a gate terminal thereof and initializes the data voltage Vdata during an (n−1)th frame period. The third and fourth transistors M3 and M4, which are mirror-type transistors, have commonly connected gate terminals, so that a voltage corresponding to the difference between the data voltage Vdata supplied from the first transistor M1 and a threshold voltage of the third transistor M3 is applied to the gate terminal of the fourth transistor M4. The storage capacitor $C_{st}$ is connected between a first voltage line Vdd and the gate terminal of the fourth transistor M4 and maintains a data voltage Vdata-Vth for a predetermined time. The fifth transistor M15 is connected between the fourth transistor M4 and the organic light emitting diode OLED and supplies the driving current to the organic light emitting diode OLED in response to an emission control signal of an emission control line $E_n$ connected to a gate terminal thereof.

Operations of the pixel shown in FIG. 13 will now be described. Initially, during an initialization operation, when a low-level selection signal is applied to the (n−1)th scan line $S_{n-1}$, the second transistor M2 is turned on, so that the data voltage stored in the storage capacitor $C_{st}$ during the (n−1)th frame period is initialized via the second transistor M2.

During a data writing period, a data voltage Vdata is stored in the data line capacitor $C_{datamk}$.

In a data programming operation, when a low-level selection signal is applied to the scan line $S_n$, the first transistor M1 is turned on, and the mirror-type third and fourth transistors M3 and M4 are also on. Accordingly, a voltage Vdata-$Vth_{M3}$ corresponding to a difference between the data voltage Vdata stored in the data line capacitor $C_{datamk}$ and a threshold voltage $Vth_{M3}$ of the third transistor M3 is applied to the gate of the fourth transistor M4.

Finally, in an emission operation, when a low-level emission control signal is applied to the emission control line $E_n$, the fifth transistor M5 is turned on in response to an emission control signal, so that a driving current corresponding to the first voltage Vdd applied to a source terminal of the fourth transistor M4 and the voltage Vdata-$Vth_{M3}$ applied to the gate terminal thereof is applied to the organic light emitting diode OLED. Thus, the organic light emitting diode OLED emits light according to the data signal.

The driving current supplied to the organic light emitting diode OLED can be expressed as Equation 4:

$$I_{OLED}=k(Vgs_{M4}-Vth_{M4})^2=k(Vdd-Vdata+Vth_{M3}-Vth_{M4})^2=k(Vdd-Vdata)^2 \quad (4)$$

where $I_{OLED}$ is the current supplied to the organic light emitting diode OLED, $Vgs_{M4}$ is the voltage between the source and gate of the fourth transistor M4, $Vth_{M3}$ is the threshold voltage of the third transistor M3, $Vth_{M4}$ is the threshold voltage of the fourth transistor M4, Vdata is the data voltage, and k is a constant. Here, when the third transistor M3 is equal in threshold voltage to the fourth transistor M4, i.e., when $Vth_{M3}=Vth_{M4}$, the threshold voltages of the transistors can be compensated, thus the organic light emitting diode OLED can keep the driving current constant.

Figure 14:
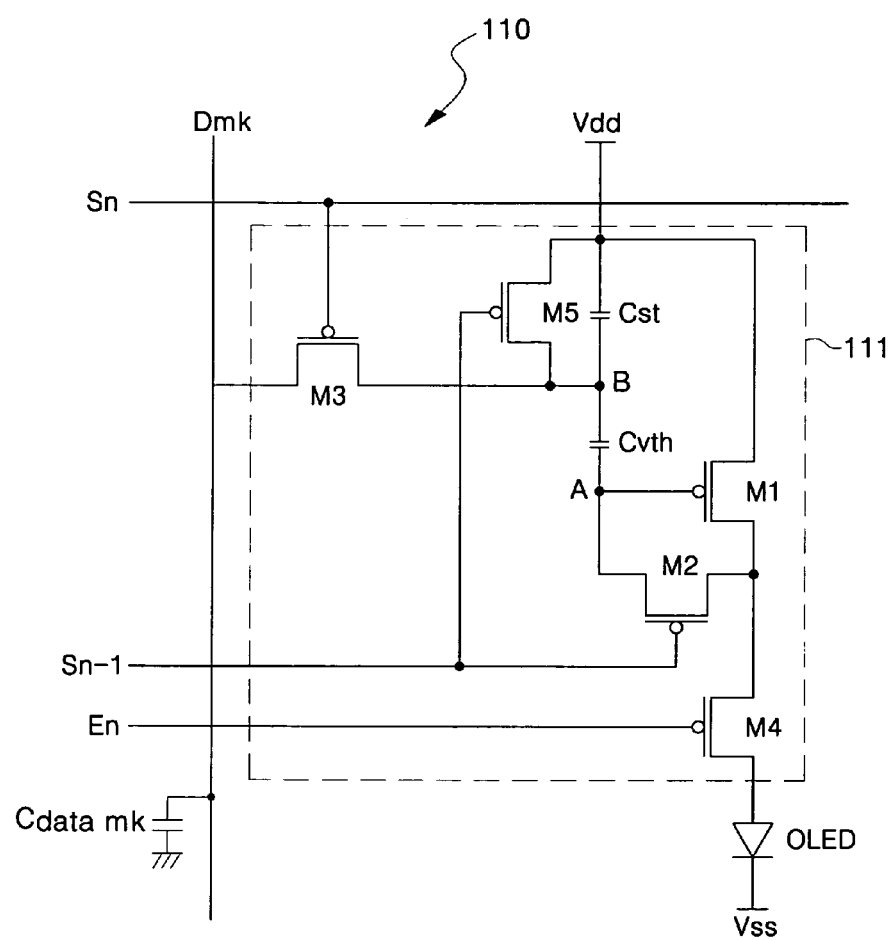
FIG. 14 is a circuit diagram of still another pixel of the OLED shown in FIG. 2.

FIG. 14 is a circuit diagram of still another pixel of the OLED shown in FIG. 2.

Referring to FIG. 14, a pixel 110 includes an organic light emitting diode OLED, which emits light according to a driving current, and a pixel driving circuit 111, which supplies the driving current to the organic light emitting diode OLED. A data voltage Vdata, which is stored in a data line capacitor $C_{datamk}$ during a data writing period, is applied to the pixel driving circuit 111, which includes first through fifth TFTs M1-M5 and two capacitors $C_{st}$ and $C_{vth}$.

The first transistor M1, which is a driving transistor for driving the organic light emitting diode OLED, is connected between a first voltage line Vdd and the fourth transistor M4 and controls the driving current passing through the organic light emitting diode OLED using a voltage applied to a gate thereof. The second transistor M2 diode-connects the first transistor M1 in response to a selection signal supplied from an (n−1)th scan line $S_{n-1}$.

One node A of the threshold voltage compensation capacitor $C_{vth}$ is connected to the gate of the first transistor M1, and the storage capacitor $C_{st}$ and the fifth transistor M5 are connected in parallel between the other node B of the threshold voltage compensation capacitor $C_{vth}$ and the first voltage line Vdd. The fifth transistor M5 applies the first voltage Vdd to the node B of the threshold voltage compensation capacitor $C_{vth}$ in response to the selection signal supplied from the (n−1)th scan line $S_{n-1}$.

The third transistor M3 transmits the data voltage Vdata supplied from a data line $D_{mk}$ to the node B of the threshold voltage compensation capacitor $C_{vth}$ in response to a selection signal supplied from an nth scan line $S_n$. The fourth transistor M4 is connected between the first transistor M1 and the organic light emitting diode OLED and connects or disconnects the first transistor M1 and the organic light emitting diode OLED in response to an emission control signal supplied from an emission control line $E_n$.

Operations of the foregoing pixel shown in FIG. 14 will now be described. Initially, when a low-level selection signal is applied to the (n−1)th scan line $S_{n-1}$, the second transistor M2 is turned on so that the first transistor M1 is diode-connected. Thus, a voltage between the gate and source of the first transistor M1 is changed until it reaches a threshold voltage Vth of the first transistor M1. In this case, since the source of the first transistor M1 is connected to the first voltage Vdd, a voltage applied to the gate of the first transistor M1, i.e., a voltage applied to the node A of the threshold voltage compensation capacitor $C_{vth}$ becomes a difference between the first voltage Vdd and the threshold voltage Vth. Also, the fifth transistor M5 is turned on so that the first voltage Vdd is applied to the node B of the storage capacitor $C_{vth}$, thus a voltage $V_{Cvth}$ charged in the threshold voltage compensation capacitor $C_{vth}$ can be expressed as Equation 5:

$$V_{Cvth}=V_B-V_A=Vdd-(Vdd-Vth)=Vth \quad (5)$$

where $V_{Cvth}$ is the voltage charged in the capacitor $C_{vth}$, $V_A$ is the voltage applied to the node A of the capacitor $C_{vth}$, and $V_B$ is the voltage applied to the node B of the capacitor $C_{vth}$.

Next, during a data writing period, the data voltage Vdata is stored in the data line capacitor $C_{datamk}$ via the data line $D_{mk}$. Thereafter, when a low-level selection signal is applied to the nth scan line $S_n$, the third transistor M3 is turned on so that the data voltage Vdata is applied to the node B. Also, since a voltage corresponding to the threshold voltage Vth of the first transistor M1 is charged in the threshold voltage compensation capacitor $C_{vth}$, a voltage corresponding to a difference between the data voltage Vdata and the threshold voltage Vth of the first transistor M1 is applied to the gate of the first transistor M1.

Finally, the fourth transistor M4 is turned on in response to a low-level signal supplied from the emission control line $E_n$, so that a current $I_{OLED}$ according to a gate-source voltage $V_{GS}$ of the first transistor M1 is applied to the organic light emitting diode OLED. Thus, the organic light emitting diode OLED emits light according to the applied data.

The current $I_{OLED}$ supplied to the organic light emitting diode OLED can be expressed as Equation 6:

$$I_{OLED}=k(Vgs-Vth)^2=k(Vdd-Vdata+Vth)-Vth^2=k(Vdd-Vdata)^2 \quad (6)$$

where $I_{OLED}$ is the current supplied to the organic light emitting diode OLED, Vgs is the voltage between the source and gate of the first transistor M1, Vth is the threshold voltage of the first transistor M1, Vdata is the data voltage, and k is a constant. As described above, since the current $I_{OLED}$ supplied to the organic light emitting diode OLED is determined by the first voltage Vdd and the data voltage Vdata, luminance non-uniformity of the driving transistor M1 caused by a difference in threshold voltage is resolved.

As described above, the OLED can reduce the number of output lines and the production cost because data signals supplied from one output line can be divided and applied to a plurality of data lines using demultiplexers.

Also, voltages corresponding to data signals are sequentially charged in data line capacitors and the charged voltages are applied to pixels at the same time, so that the OLED can display an image with uniform luminance.

Further, a scan period for which a scan signal is supplied does not overlap a data writing period for which a data signal is supplied, thus the OLED can stably display an image. In addition, as the capacitance of a data line capacitor formed in a data line is much greater than the capacitance of a storage capacitor, the OLED can display exact gray scale and have uniform luminance.

While the above detailed description has shown, described, and pointed out novel features as applied to various embodiments, it will be understood that various omissions, substitutions, and changes in the form and details of the device or process illustrated may be made by those skilled in the art without departing from the scope of the invention. As will be recognized, the present invention may be embodied within a form that does not provide all of the features and benefits set forth herein, as some features may be used or practiced separately from others. Additionally certain features may be practiced in combinations not specifically described in any one embodiment discussed herein.

What is claimed is:

1. An organic light emitting display (OLED) comprising:
    a display panel having a plurality of pixels, wherein each of the pixels is adjacent to an intersection of a scan line and a data line;
    a scan driver configured to supply scan signals to the scan lines so as to select the pixels;
    a plurality of demultiplexers configured to supply data signals to the data lines; and
    a data driver configured to supply the data signals to a plurality of output lines connected to the demultiplexers,
    wherein each pixel is connected to one of the scan lines and to one of the data lines, and each pixel comprises:
        an organic light emitting diode;
        a data line capacitor component directly connected to a ground line and directly connected to the one data line and configured to store voltages corresponding to the data signals supplied to the one data line; and
        a pixel driving circuit connected to a first power supply line,
    wherein the pixel driving circuit comprises:
        a storage capacitor that receives a data voltage from the data line capacitor component and stores the data voltage for a frame,
        a driving transistor having a gate connected to a first terminal of the storage capacitor, the driving transistor being configured to generate a driving current;
        a first switching transistor connected to the one data line and to the driving transistor, the first switching transistor being configured to turn on in response to an nth scan signal so as to transmit the data voltage to the driving transistor; and
        an initialization transistor directly connected between the gate of the driving transistor and an initialization power supply line different from the first power supply line, the initialization transistor being configured to turn on in response to an (n−1)th scan signal to initialize the storage capacitor;
    wherein the organic light emitting diode is connected between the driving transistor and a second power supply line, and the organic light emitting diode is configured to receive the driving current and to emit light according to the driving current.

2. The OLED according to claim 1, wherein the data line capacitor component has a larger capacitance than the storage capacitor.

3. The OLED according to claim 2, wherein the data line capacitor component has a capacitance of about 20 pF to about 50 pF.

4. The OLED according to claim 1, wherein the pixel driving circuit further comprises:
    a threshold voltage compensation transistor connected between the gate and a second terminal of the driving transistor, the threshold voltage compensation transistor being configured to turn on in response to the nth scan signal so as to diode-connect the driving transistor so as to compensate for a threshold voltage of the driving transistor; and
    a second switching transistor connected between the first power supply line and the second terminal of the driving transistor, the second switching transistor being configured to turn on in response to an nth emission control signal so as to supply the first power supply to the second terminal of the driving transistor.

5. The OLED according to claim 4, wherein the pixel driving circuit further comprises an emission control transistor, which is connected between the driving transistor and the organic light emitting diode, the emission control transistor being configured to turn on in response to the nth emission control signal so as to supply the driving current to the organic light emitting diode.

6. The OLED according to claim 5, wherein the first through sixth transistors are metal oxide semiconductor field effect transistors (MOSFETs) of the same conductivity type (one of N and P types).

7. The OLED according to claim 1, further comprising a demultiplexer controller configured to output control signals, the control signals being configured to turn on and off the respective demultiplexers.

8. The OLED according to claim 7, wherein the data driver is configured to sequentially supply a plurality of data signals to each of one or more of the output lines between an (n−1)th scan period and an nth scan period.

9. The OLED according to claim 8, wherein each of the demultiplexers comprises a plurality of transistors that are connected between one of the output lines and at least two of the data lines, the transistors being configured to sequentially turn on in response to the control signals and to sequentially transmit the sequentially supplied data signals to the data line capacitor components.

10. The OLED according to claim 9, wherein the data line capacitor components are configured to apply the data voltage stored in each of the data line capacitor components to the pixels during the nth scan period.

* * * * *